US006592739B1

(12) United States Patent
Sonoda et al.

(10) Patent No.: US 6,592,739 B1
(45) Date of Patent: Jul. 15, 2003

(54) PROCESS AND APPARATUS FOR FORMING ZINC OXIDE FILM, AND PROCESS AND APPARATUS FOR PRODUCING PHOTOVOLTAIC DEVICE

(75) Inventors: Yuichi Sonoda, Nara (JP); Kozo Arao, Santa Clara, CA (US); Noboru Toyama, Hirakata (JP); Yusuke Miyamoto, Kyotanabe (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/722,652

(22) Filed: Nov. 28, 2000

(30) Foreign Application Priority Data

Nov. 29, 1999 (JP) .............................................. 11-337029
Oct. 30, 2000 (JP) ...................................... 2000-329907

(51) Int. Cl.⁷ ................................................. C25D 7/06
(52) U.S. Cl. .................................................... 205/141
(58) Field of Search ................................ 205/138, 141, 205/333

(56) References Cited

U.S. PATENT DOCUMENTS

| 6,132,569 A | 10/2000 | Shiozaki | 204/192.27 |
| 6,133,061 A | 10/2000 | Sonoda | 438/69 |
| 6,149,781 A | * 11/2000 | Forand | 204/239 |

FOREIGN PATENT DOCUMENTS

| JP | 10178193 | 6/1998 |
| JP | 11286799 | 10/1999 |

OTHER PUBLICATIONS

"Light Entrapment Effect in a–Si Solar Cells on 29p–MF–22 Stainless Steel Substrates" (autumn, 1990), The 51$^{st}$ Applied Physics Society Scientific Lecture Meeting, Lecture Drafts p. 747, No month available.
Sannomiya et al., "a–SiC/a–Si/a–SiGe Multi–Bandgap Stacked Solar Cells with Bandgap Profiling" Technical Digest of the International; PVSEC–5, Kyoto, Japan, 1990 p. 387–390, No month available.

* cited by examiner

*Primary Examiner*—Edna Wong
(74) *Attorney, Agent, or Firm*—Fitzpatrick, Cella, Harper & Scinto

(57) ABSTRACT

Disclosed are an electrodeposition process comprising the steps of transporting a substrate in an electrodeposition bath, and forming a film on the substrate, which process further comprises the step of removing particles from the surface of the substrate; and an electrodeposition apparatus comprising an electrodeposition tank for holding therein an electrodeposition bath, a mechanism for transporting a continuous-length-substrate while holding the substrate thereon, and an opposing electrode, which apparatus further comprises a mechanism for removing particles from the surface of the continuous-length substrate. These can provide a process and an apparatus by and in which dust in the bath or any particles due to film-peeling from electrodes can be prevented from causing difficulties such as impact marks in a film-deposited substrate during its transport, to form a good-quality electrodeposited film.

12 Claims, 17 Drawing Sheets

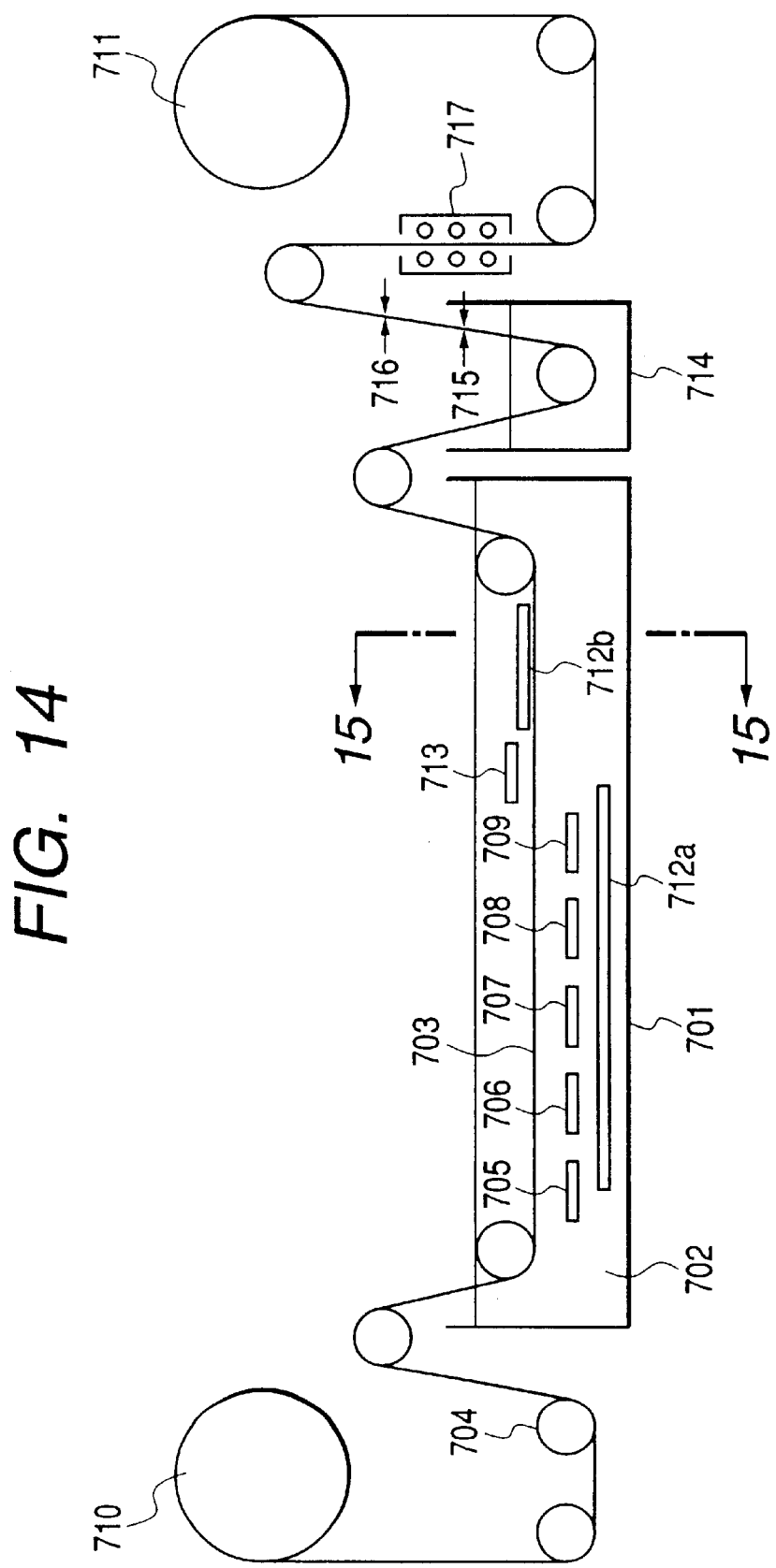

PROCESS AND APPARATUS FOR FORMING ZINC OXIDE FILM, AND PROCESS AND APPARATUS FOR PRODUCING PHOTOVOLTAIC DEVICE

BACKGROUND OF THE INVENTION

1. Field of the Invention

This invention relates to a process for forming a zinc oxide film, an apparatus for forming a zinc oxide film, and a process, and an apparatus, for producing a photovoltaic device by using the same.

2. Related Background Art

Photovoltaic devices comprised of amorphous silicon hydride, amorphous silicon germanium hydride, amorphous silicon hydride carbide, microcrystalline silicon or polycrystalline silicon are conventionally provided with reflecting layers on their backs in order to improve light-collection efficiency in the long-wavelength regions. It is desirable for such-reflecting layers to show effective reflection characteristics at wavelengths which are close to band edges of semiconductor materials and at which absorption becomes small, i.e., wavelengths of 800 nm to 1,200 nm. Those which can fulfill such a condition are reflecting layers formed of a metal such as gold, silver, copper or aluminum. It is also prevalent to provide an uneven layer which is optically transparent within a stated wavelength region. This transparent uneven layer is provided between the metal layer and a semiconductor active layer so that reflected light can effectively be utilized to improve short-circuit current density Jsc. In order to prevent characteristics from lowering because of shunt pass, it is still also prevalent to provide between the metal layer and a semiconductor layer a layer formed of a light-transmitting material showing a conductivity, i.e., a transparent conductive layer. This transparent conductive layer and the above transparent uneven layer may be the same layer. In general, these layers are deposited by a process such as vacuum evaporation or sputtering and show an improvement in short-circuit current density Jsc by 1 mA/cm² or above.

As an example thereof, in "Light Entrapment Effect in a-Si Solar Cells on 29p-MF-22 Stainless Steel Substrates" (autumn, 1990), The 51st Applied Physics Society Scientific Lecture Meeting, Lecture Drafts p.747, 'P-IA-15a-SiC/a-Si/a-SiGe Multi-Bandgap Stacked Solar Cells with Bandgap Profiling', Sannomiya et al., Technical Digest of The International PVSEC-5, Kyoto, Japan, p.381, 1990, reflectance and texture structure are studied on a reflecting layer constituted of silver atoms. In this example, it is reported that the reflecting layer is deposited in double layer of silver by changing substrate temperature, to form effective unevenness, which has achieved an increase in short-circuit current in virtue of light entrapment effect.

The transparent layer used as a light entrapment layer is deposited by vacuum evaporation utilizing resistance heating or electron beams, sputtering, ion implantation or CVD (chemical vapor deposition). However, the facts of high wages for preparing target materials and so forth, a large repayment for vacuum apparatus and not a high utilization efficiency of materials make very high the cost for photovoltaic devices produced by these techniques, and put a high barrier to industrial application of solar cells.

As a technique for forming a zinc oxide film by electrodeposition from an aqueous solution, intended to solve these problems, Japanese Patent Application Laid-Open No. 10-178193 discloses its combination with a metal layer and a transparent conductive layer which are formed by sputtering, applied as a reflecting layer of photovoltaic devices (solar cells). Also, as an improved technique of such a zinc oxide production technique, Japanese Patent Application Laid-Open No. 11-286799 by the present inventors discloses a technique in which a back-side film adhesion preventive electrode is provided to form zinc oxide films by electrodeposition causative of less or no back deposition.

These methods do not require any expensive vacuum apparatus and any expensive targets, and can dramatically reduce the production cost for zinc oxide films. These also enable deposition on a large-area substrate, and are full of promise for large-area photovoltaic devices such as solar cells. However, these methods of making deposition electrochemically have matters to be improved, as shown below.

1) The back-side film adhesion preventive electrode removes any unwanted electrodeposited film (zinc oxide film) deposited on the back surface, but in that course the zinc oxide film removed keeps depositing on the back-side film adhesion preventive electrode. After its use for a long time, the deposited film comes off from the back-side film adhesion preventive electrode because of film stress or the like and film pieces fall on the substrate. The zinc oxide film having deposited on the back-side film adhesion preventive electrode is of hard and brittle nature. Hence, when film pieces are held between a roller and a substrate to become crushed, they are broken into sand. This zinc oxide broken into sand adheres to the transport roller surface to cause the occurrence of impact marks continually.

2) Where such film pieces or adsorbed matter have or has passed the roller as they are, crushed film pieces not only cause the occurrence of impact marks continually but also cause the occurrence of dents, scratches and so forth at the roller surface to make the roller have a short lifetime, resulting in a great damage on the apparatus.

3) Dust of white powdery zinc oxide coming out from the anode also drifts or floats in the bath. Such dust is so treated as to be removed with a filter attached to the apparatus. However, before it is removed with the filter, it becomes adsorbed on the film-deposited substrate to cause impact marks when it passes the transport roller as it is.

4) The impact marks having thus occurred not only make poor the surface appearance required as solar cell substrates, but also may cause cracks and film-peeling in zinc oxide film deposited by electrodeposition. Where such zinc oxide film is used as a part of a photovoltaic device, the cracks and film-peeling cause shunt pass of the photovoltaic device, as so considered.

SUMMARY OF THE INVENTION

Accordingly, the present invention was made taking account of such circumstances, and an object of the present invention is to establish a technique for mass production of zinc oxide films by electrodeposition, and, in an electrodeposition process combined with substrate transportation of a roll-to-roll system or the like, to prevent occurrence of the above impact marks to stably form high-quality and low-cost zinc oxide films over a long period of time, the films being free of cracks and film-peeling, so as to contribute to real spread of sunlight electricity generation by incorporating such zinc oxide films in photovoltaic devices.

Another object of the present invention is, without limitation to the formation of zinc oxide films, to provide a process, and an apparatus, for forming good-quality electrodeposited films, preventing difficulties such as impact marks from being caused in the substrate in the course of its transport by any particles due to dust floating in the bath or film having peeled from the electrode.

To achieve the above objects, as a preferred embodiment, the present invention provides a process for forming a zinc oxide film in an electrodeposition bath provided therein with a continuous-length substrate, an opposing electrode and a back-side film adhesion preventive electrode, to form the zinc oxide film on the continuous-length substrate while transporting the continuous-length substrate under electrification so made as to be in the relation of potential which stands back-side film adhesion preventive electrode<continuous-length substrate<opposing electrode; the process comprising the step of removing particles from the surface of the continuous-length substrate. It also provides a process for producing a photovoltaic device, having at least the steps of forming a zinc oxide film by the above zinc oxide film formation process, and forming a semiconductor layer on the zinc oxide film.

As a preferred embodiment, the present invention also provides an apparatus for forming a zinc oxide film, comprising an electrodeposition tank for holding therein an electrodeposition bath, a mechanism for transporting a continuous-length substrate, holding the substrate thereon, an opposing electrode, a back-side film adhesion preventive electrode, and a power source and wiring for so making electrification as to be in the relation of potential which stands back-side film adhesion preventive electrode<continuous-length substrate<opposing electrode; the apparatus further comprising a mechanism for removing particles from the surface of the continuous-length substrate. It also provides an apparatus for producing a photovoltaic device having at least the above apparatus for forming a zinc oxide film, and an apparatus for forming a semiconductor layer by plasma CVD to form the semiconductor layer on the zinc oxide film.

As another preferred embodiment of the process, the present invention provides a process for forming a zinc oxide film on a continuous-length substrate while transporting the continuous-length substrate in an electrodeposition bath; the process comprising the step of removing particles from the surface of the continuous-length substrate.

As still another preferred embodiment of the process, the present invention provides a process for forming a zinc oxide film, comprising the steps of transporting a substrate in an electrodeposition bath, and forming the zinc oxide film on the substrate; the process further comprising the step of removing particles from the surface of the substrate.

As another preferred embodiment of the apparatus, the present invention provides an apparatus for forming a zinc oxide film, comprising an electrodeposition tank for holding therein an electrodeposition bath, a mechanism for transporting a continuous-length substrate, holding the substrate thereon, and an opposing electrode; the apparatus further comprising a mechanism for removing particles from the surface of the continuous-length substrate.

As still another preferred embodiment of the apparatus, the present invention provides an apparatus for forming a zinc oxide film, comprising an electrodeposition tank for holding therein an electrodeposition bath, a mechanism for transporting a substrate, holding the substrate thereon, and an opposing electrode; the apparatus further comprising a mechanism for removing particles from the surface of the substrate.

In addition, without limitation to the process and apparatus for forming a zinc oxide film, the present invention also provides an electrodeposition process, and an electrodeposition apparatus, for forming other film.

Stated specifically, the present invention also provides;

an electrodeposition process for forming a film in an electrodeposition bath provided therein with a continuous-length substrate, an opposing electrode and a back-side film adhesion preventive electrode, to form the film on the continuous-length substrate while transporting the continuous-length substrate under electrification so made as to be in the relation of potential which stands back-side film adhesion preventive electrode<continuous-length substrate<opposing electrode; the process comprises the step of removing particles from the surface of the continuous-length substrate;

an electrodeposition process for forming a film on a continuous-length substrate while transporting the continuous-length substrate in an electrodeposition bath; the process comprising the step of removing particles from the surface of the continuous-length substrate;

an electrodeposition process comprising the steps of transporting a substrate in an electrodeposition bath, and forming a film on the substrate; the process further comprising the step of removing particles from the surface of the substrate;

an electrodeposition apparatus comprising an electrodeposition tank for holding therein an electrodeposition bath, a mechanism for transporting a continuous-length substrate, holding the substrate thereon, an opposing electrode, a back-side film adhesion preventive electrode, and a power source and wiring for so making electrification as to be in the relation of potential which stands back-side film adhesion preventive electrode<continuous-length substrate<opposing electrode; the apparatus further comprising a mechanism for removing particles from the surface of the continuous-length substrate;

an electrodeposition apparatus comprising an electrodeposition tank for holding therein an electrodeposition bath, a mechanism for transporting a continuous-length substrate, holding the substrate thereon, and an opposing electrode; the apparatus further comprising a mechanism for removing particles from the surface of the continuous-length substrate; and an electrodeposition apparatus comprising an electrodeposition tank for holding therein an electrodeposition bath, a mechanism for transporting a substrate, holding the substrate thereon, and an opposing electrode; the apparatus further comprising a mechanism for removing particles from the surface of the substrate.

More preferred embodiments of the process of the present invention may include;

an embodiment in which the particles are removed by means of a member comprising an insulating material;

an embodiment in which the particles are removed by means of a member so disposed that its longitudinal direction is in a direction not being at right angles to the transport direction of the continuous-length substrate; the member being brought into contact with the continuous-length substrate to make the particles move in a direction different from the transport direction of the continuous-length substrate;

an embodiment in which the particles are particles having come off from the back-side film adhesion preventive electrode;

an embodiment in which the particles are dust floating in the bath;

an embodiment in which the particles are removed by convection of the electrodeposition bath;

an embodiment in which the electrodeposition bath is convected in a direction of convection which is different from the transport direction of the continuous-length substrate, to make the particles move in a direction different from the transport direction of the continuous-length substrate;

an embodiment in which the particles are removed by spraying a liquid or blowing a gas on the continuous-length substrate;

an embodiment in which the liquid or gas is sprayed or blown in a direction different from the transport direction of the continuous-length substrate, to make the particles move in a direction different from the transport direction of the continuous-length substrate;

an embodiment in which the particles are removed after the continuous-length substrate has passed a region where the continuous-length substrate faces the back-side film adhesion preventive electrode and before the continuous-length substrate comes into contact with a mechanism for transporting the continuous-length substrate;

an embodiment in which the mechanism for transporting the continuous-length substrate is a roller.

More preferred embodiments of the apparatus of the present invention may also include;

an embodiment in which the mechanism for removing particles comprises a member comprising an insulating material;

an embodiment in which the mechanism for removing particles comprises a member which is so disposed that its longitudinal direction is in a direction not being at right angles to the transport direction of the continuous-length substrate, and comes into contact with the continuous-length substrate;

an embodiment in which the mechanism for removing particles is a mechanism for causing convection of the electrodeposition bath;

an embodiment in which the mechanism causing convection of the electrodeposition bath causes the electrodeposition bath to convect in a direction different from the transport direction of the continuous-length substrate;

an embodiment in which the mechanism for removing particles comprises a mechanism for spraying a liquid or blowing a gas on the continuous-length substrate;

an embodiment in which the direction in which the liquid or gas is sprayed or blown is different from the transport direction of the continuous-length substrate;

an embodiment in which the mechanism for removing particles is provided between a region where the continuous-length substrate faces the back-side film adhesion preventive electrode and a mechanism for transporting the continuous-length substrate with which mechanism the continuous-length substrate comes into contact first after the continuous-length substrate has passed that region; and an embodiment in which the mechanism for transporting the continuous-length substrate is a roller.

BRIEF DESCRIPTION OF THE DRAWINGS

FIG. 14 is a diagrammatic cross-sectional view showing an example of an electrodeposition apparatus according to the present invention.

DESCRIPTION OF THE PREFERRED EMBODIMENTS

In preferred embodiments of the present invention, a zinc oxide film effective for improving solar cell characteristics and having a high reliability is formed so that it can make larger the amount of electric current produced by light-collection and also contribute to an improvement in reliability. It moreover intends to achieve such aims inexpensively and stably in an industrial scale. For this end, in a process in which a back-side film adhesion preventive electrode is provided so as to form zinc oxide film while preventing unwanted films from adhering to the back side of a substrate, a fallen-particle removal mechanism is provided so that any fallen matter on a continuous-length substrate can be removed before it passes a roller, any impact marks can be made less occur and a zinc oxide film having a high reliability can be formed. This is the basic idea of the present invention.

Figure 1:
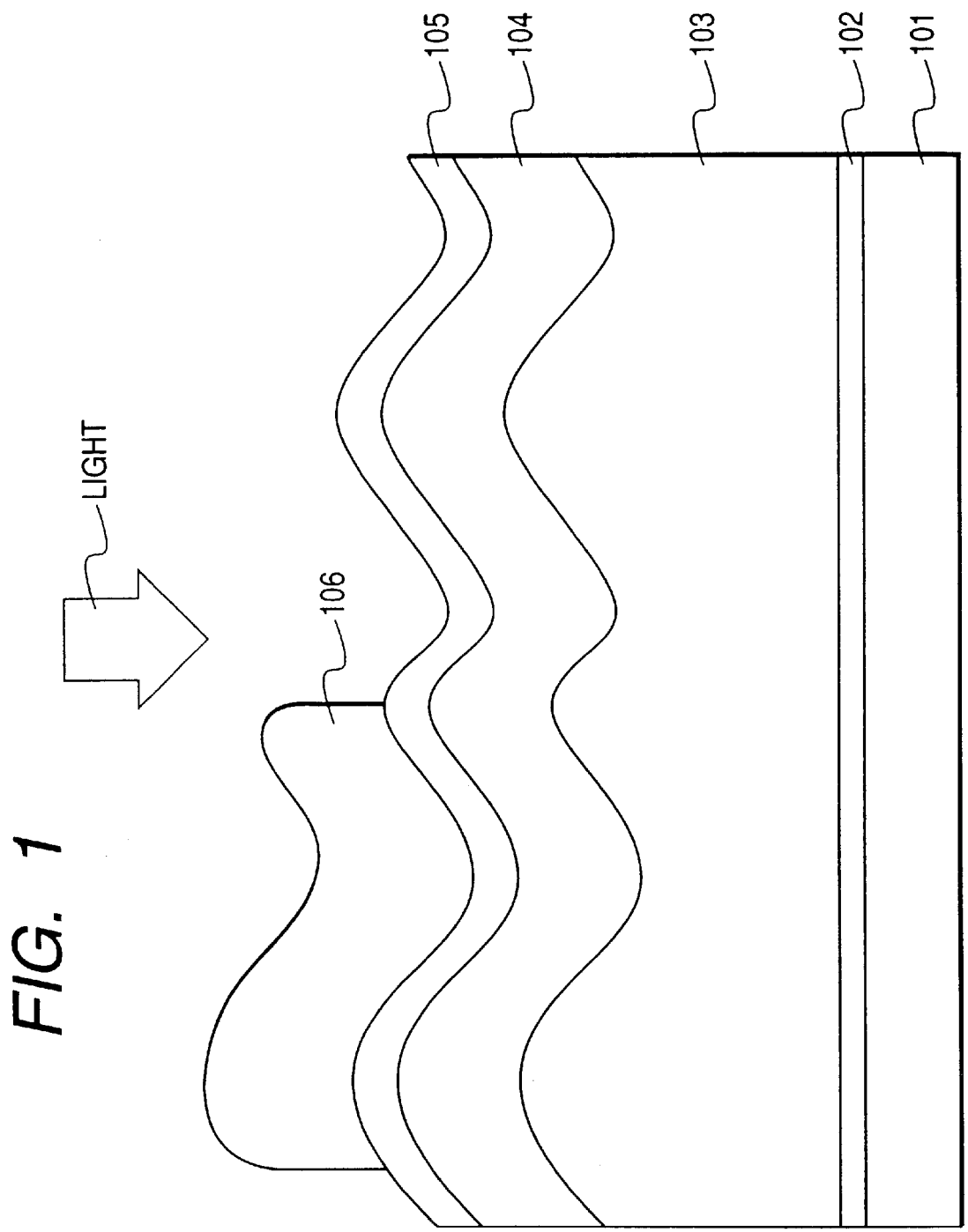
FIG. 1 is a diagrammatic cross-sectional view showing an example of a photovoltaic device produced using the present invention.

FIG. 1 is a diagrammatic cross-sectional view showing an example of a photovoltaic device produced using the present invention. In FIG. 1, reference numeral 101 denotes a support; 102, a metal layer; 103, a zinc oxide film formed by electrodeposition; 104, a semiconductor layer; 105, a transparent conductive layer; and 106, a collector electrode. The support 101 and the metal layer 102 constitute a light-reflecting metal substrate referred to in the present invention, which may also be made up using a SUS stainless steel sheet or the like having thereon a layer of a metal with good reflecting properties such as aluminum or silver and a thin zinc oxide film formed in a different way. Incidentally, when the device is so constructed that a transparent substrate is used as the support and light enters from the support side, the respective layers are formed in reverse order except for the support.

Other constituents of the present invention are described below.

Formation of Zinc Oxide Film by Electrodeposition

Figure 10:
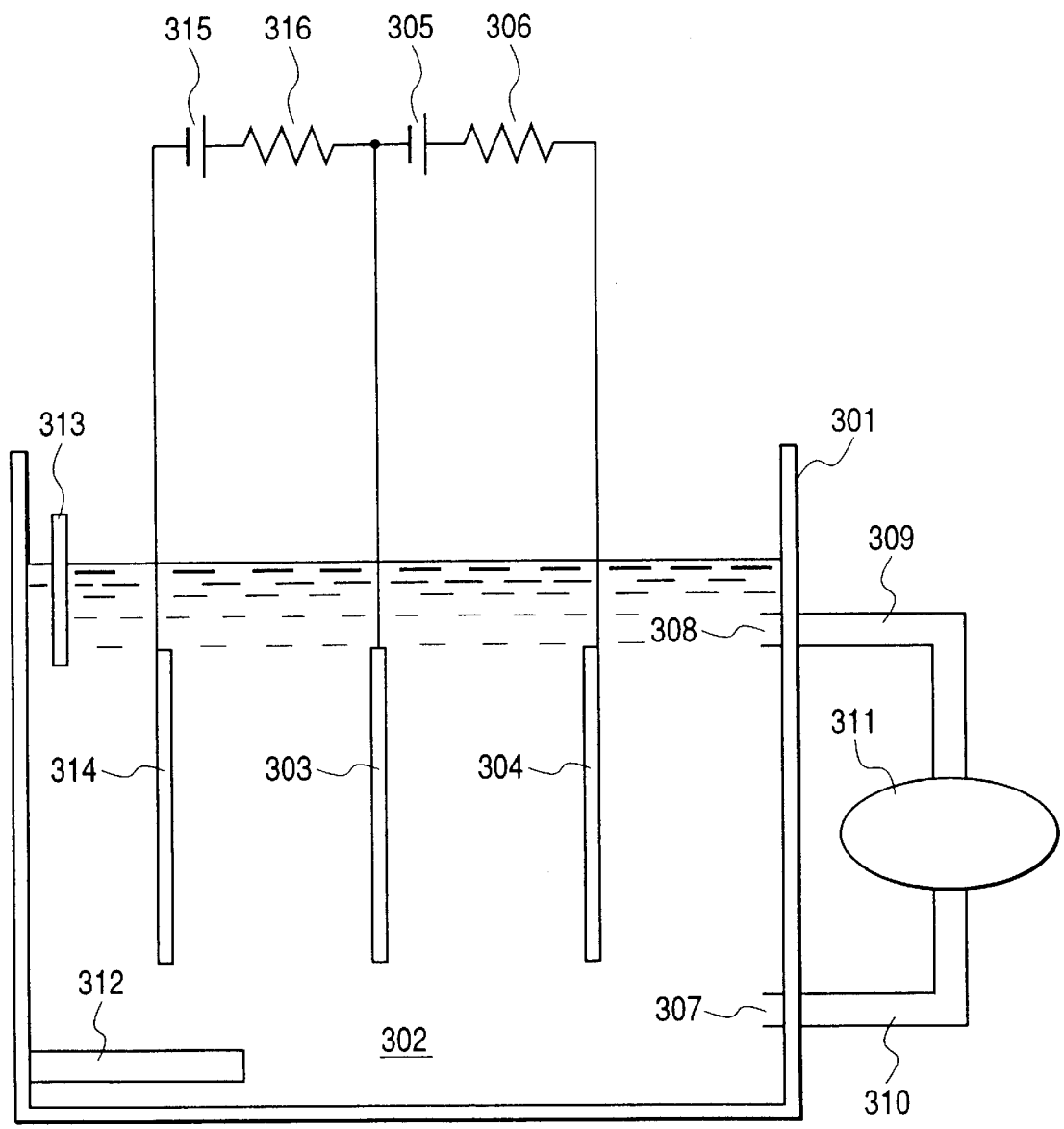
FIG. 10 is a diagrammatic cross-sectional view showing an example of an electrodeposition apparatus according to the present invention.

As a method of forming the zinc oxide film, a layer may be formed by means of, e.g., an apparatus shown in FIG. 10. In FIG. 10, reference numeral 301 denotes an anti-corrosion container. As an aqueous electrodeposition solution 302, an aqueous solution containing nitrate ions and zinc ions may preferably be used. In such a case, the nitrate ions may preferably be in an ion concentration of from 0.004 mol/liter to 6.0 mol/liter, more preferably from 0.001 mol/liter to 1.5 mol/liter, and still more preferably from 0.1 mol/liter to 1.4 mol/liter. The zinc ions may preferably be in an ion concentration of from 0.002 mol/liter to 3.0 mol/liter, more preferably from 0.01 mol/liter to 2.0 mol/liter, and still more preferably from 0.05 mol/liter to 1.0 mol/liter. In order to prevent abnormal growth, sucrose or dextrin may also preferably be contained in the aqueous solution. In such a case, the sucrose may preferably be in a concentration of from 500 g/liter to 1 g/liter, and more preferably from 100 g/liter to 3 g/liter. The dextrin may preferably be in a concentration of from 10 g/liter to 0.01 g/liter, and more preferably from 1 g/liter to 0.025 g/liter. Such measures enable well efficient formation of a zinc oxide film having a textural structure suited for the light entrapment effect.

As shown in FIG. 10, a substrate 303 (the light-reflecting metal substrate described above) and an opposing electrode 304 are connected to a power source 305 via a load resistor 306. Here, electric current may preferably be at a density of from 0.1 mA/cm$^2$ to 100 mA/cm$^2$, more preferably from 1 mA/cm$^2$ to 30 mA/cm$^2$, and still more preferably from 3 mA/cm$^2$ to 15 mA/cm$^2$ (the electric current flowing from the substrate to the opposing electrode is regarded as positive).

In FIG. 10, reference numeral 314 denotes a back-side film adhesion preventive electrode. The substrate 303 and the back-side film adhesion preventive electrode 314 are connected to a power source 315 via a load resistor 316, and a negative electric current is flowed to the substrate 303. Here, the electric current may preferably be at a density of from −0.01 A/cm$^2$ to −80 mA/cm$^2$, more preferably from −0.1 A/cm$^2$ to −15 mA/cm$^2$, and still more preferably from −1 A/cm$^2$ to −10 mA/cm$^2$ (the electric current flowing from the substrate to the back-side film adhesion preventive electrode is regarded as positive). Distance between the electrode 314 and the substrate 303 may be set not larger than 50 cm, and preferably not larger than 10 cm, whereby the back-side film adhesion preventive effect can efficiently be attained. As materials, conductive materials such as SUS stainless steel, Zn, Ti and Pt are preferred.

Solution temperature may be set at 60° C. or above, whereby a uniform zinc oxide film with less abnormal growth can be formed in a good efficiency. To stir the whole solution, a solution circulation system is used which consists of a solution pump-in opening 308, a solution pump-out opening 307, a solution circulation pump 311, a pump-in solution pipe 309 and a pump-out solution pipe 310. When the solution is of a small scale, a magnetic stirrer may be used.

Description of Working Apparatus

Figure 2:
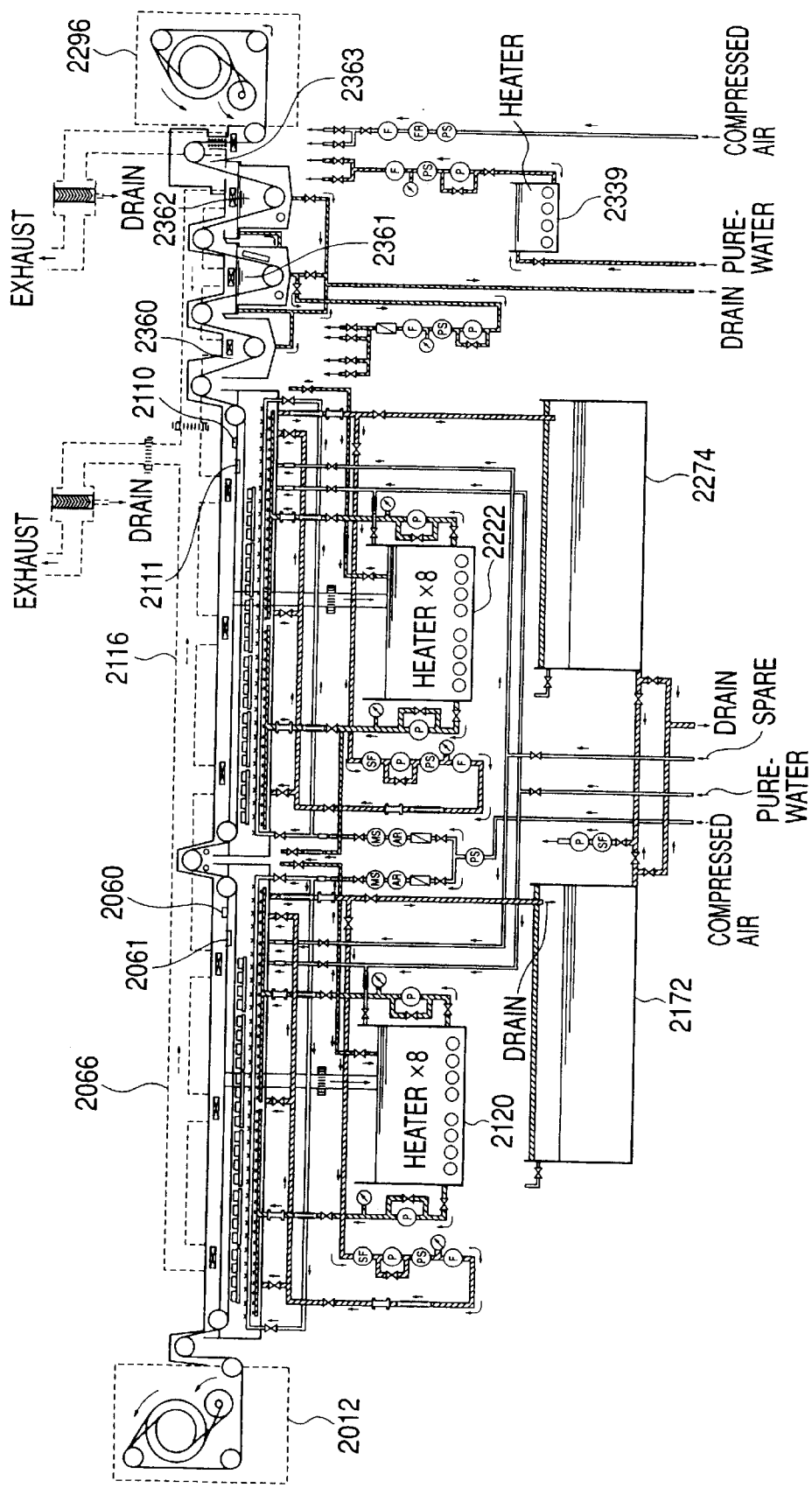
FIG. 2 is a cross-sectional illustration of an example of an electrodeposition apparatus according to the present invention.

A continuous-length substrate electrodeposition apparatus to which the present invention is applicable is shown in FIG. 2. Its dividedly enlarged views are also given in FIGS. 3 to 9. In FIG. 2 and FIGS. 3 to 9, names and reference numerals of respective members are common. A procedure for forming or depositing an electrodeposited film on a continuous-length substrate by means of this apparatus is described below with reference to these drawings.

Figure 4:
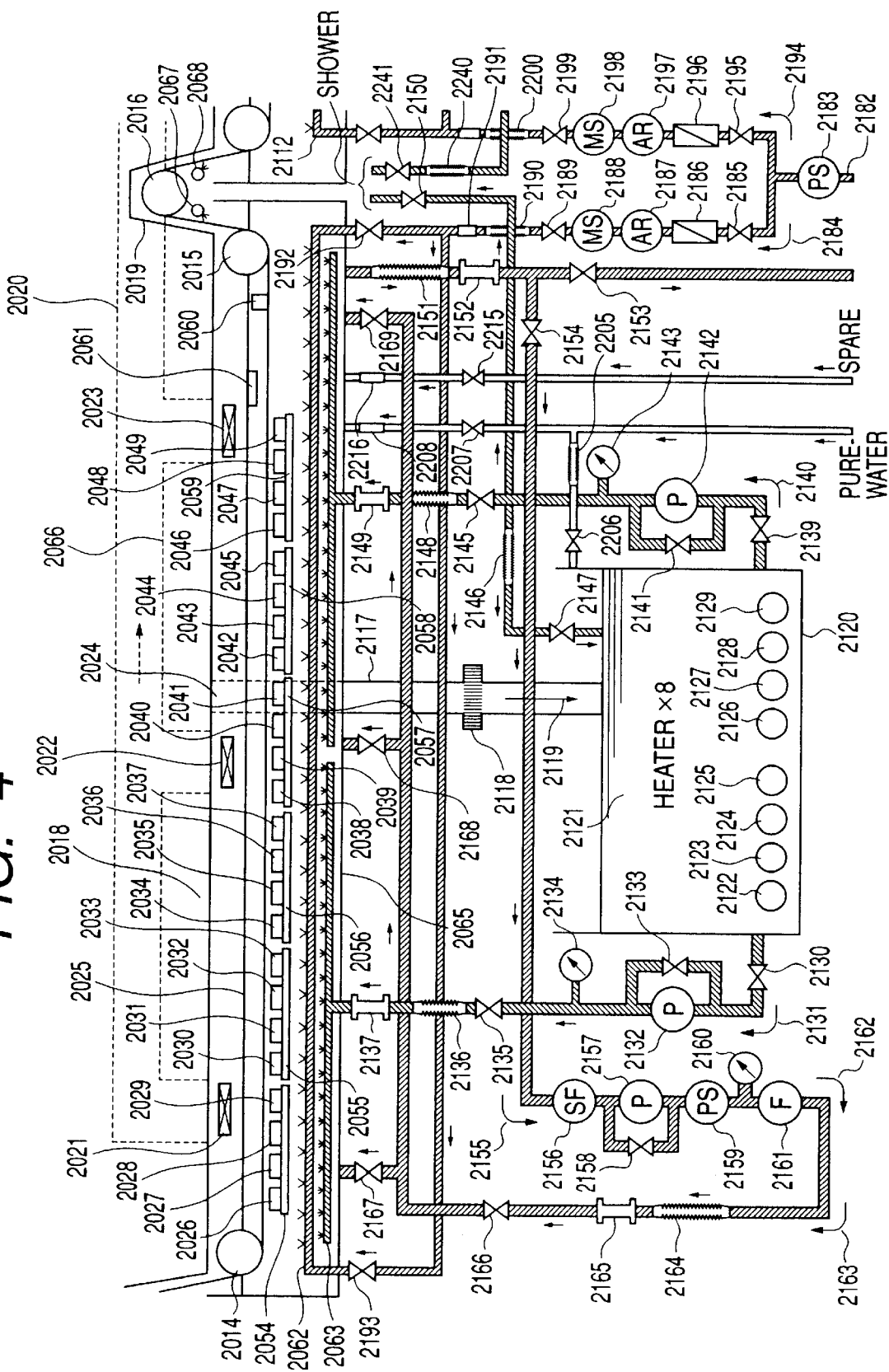
Figure 5:
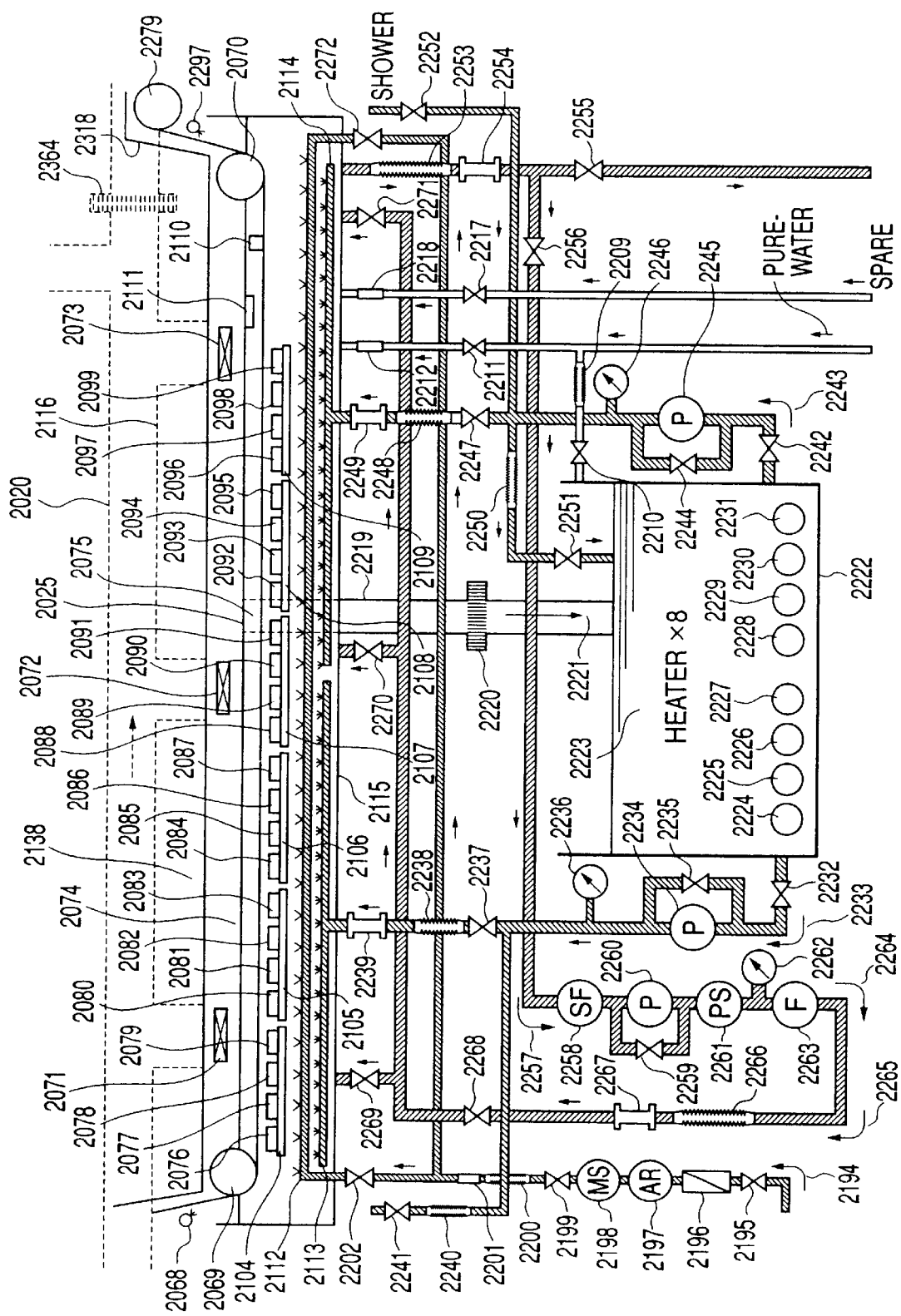
Figure 6:
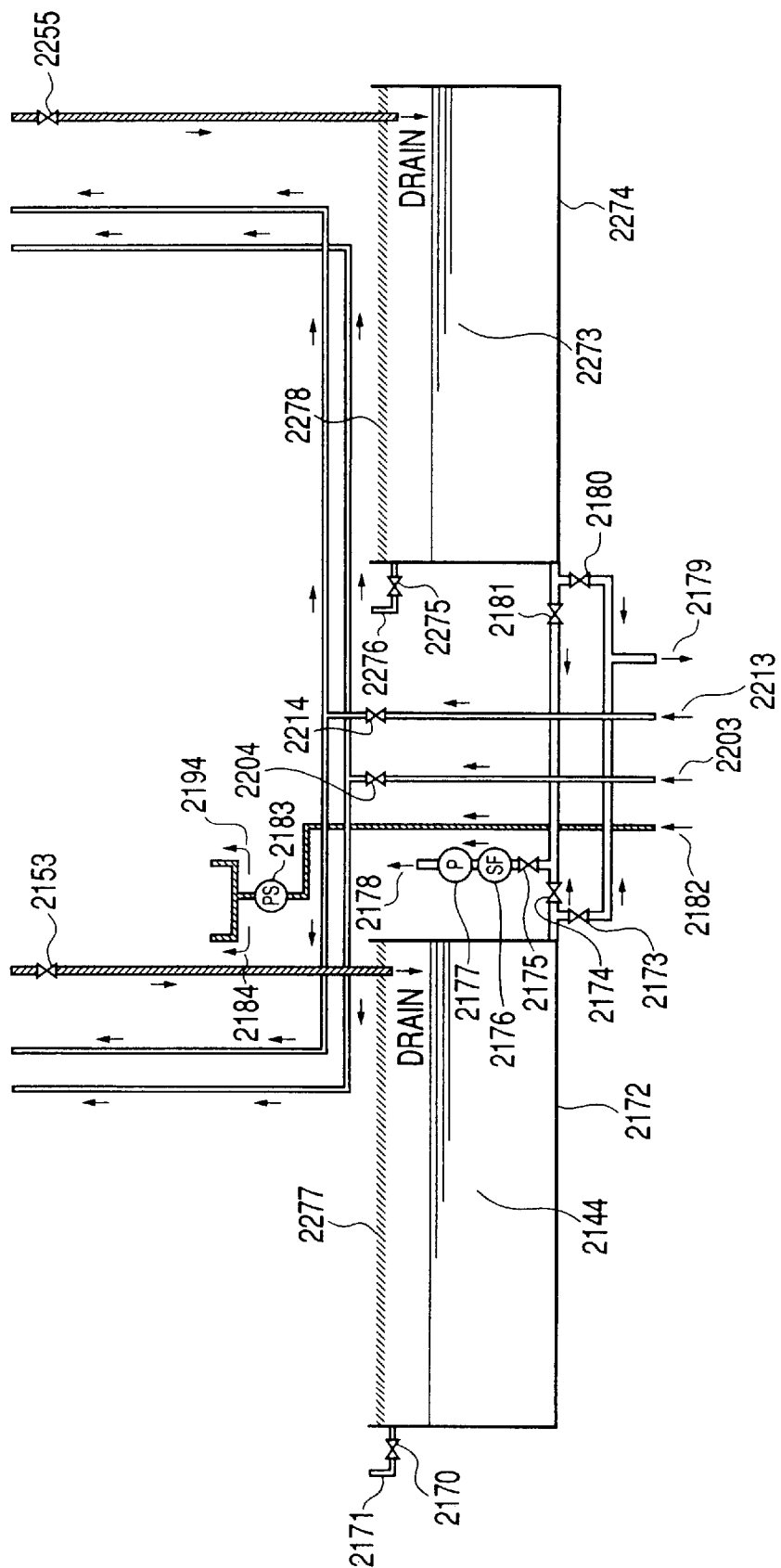
Figure 7:
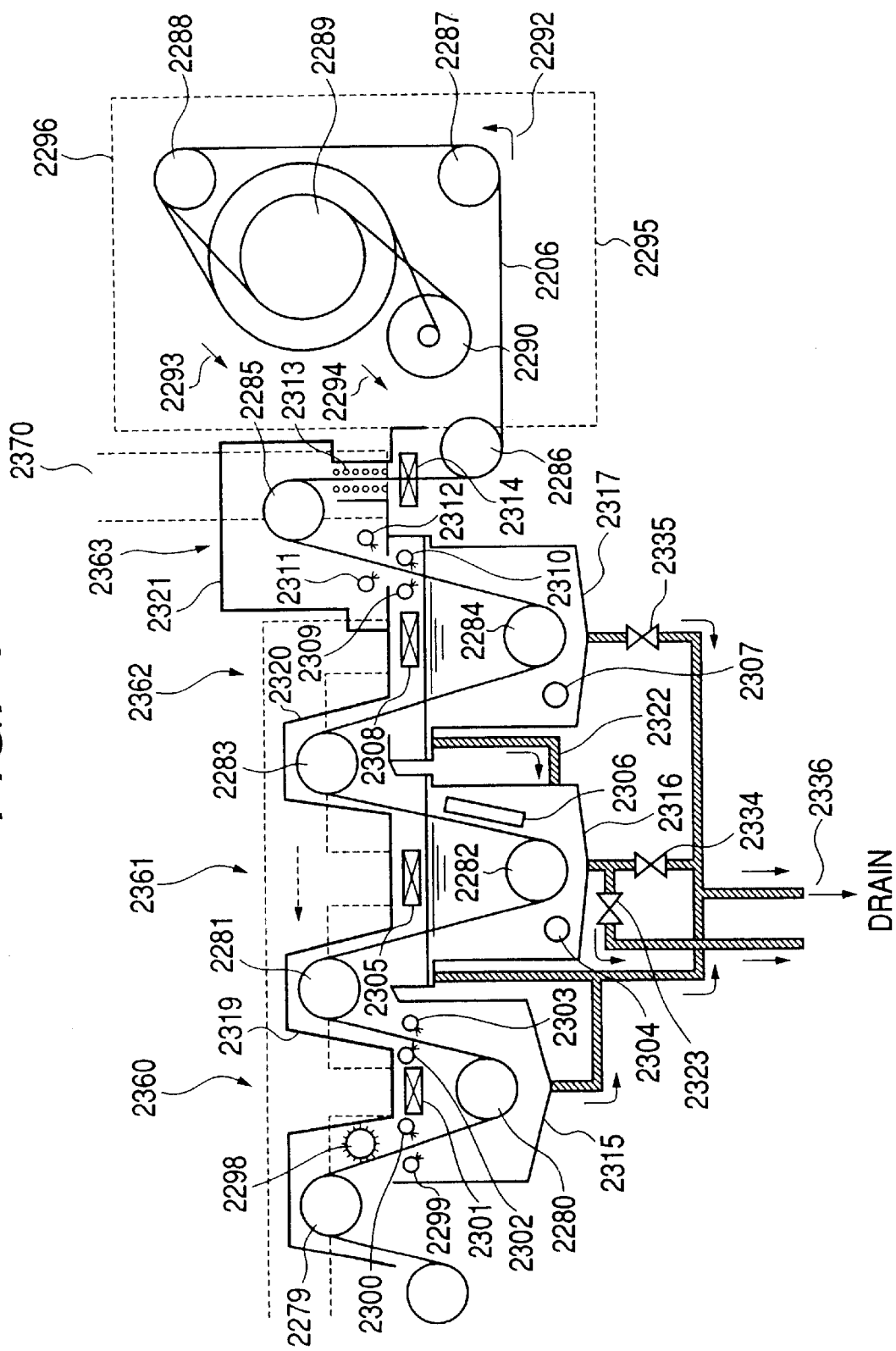

Roughly sectioned, the apparatus consists of a wind-off unit 2012 from which a continuous-length substrate wound into a coil is wound off, a first electrodeposition tank 2066 in which a first electrodeposition film is deposited or treated, a second electrodeposition tank 2116 in which a second electrodeposition film is deposited or treated, a first circulation tank 2120 from which a heated electrodeposition bath is circulatingly fed to the first electrodeposition tank, a second circulation tank 2222 from which a heated electrodeposition bath is circulatingly fed to the second electrodeposition tank, a first waste-solution tank 2172 in which the electrodeposition bath is temporarily stored before the bath of the first electrodeposition tank 2066 is discharged, a second waste-solution tank 2274 in which the electrodeposition bath is temporarily stored before the bath of the second electrodeposition tank 2116 is discharged, a filter circulation system for removing particles in the electrodeposition bath held in the first electrodeposition tank 2066 to make the bath clean (a piping system connected to a first electrodeposition tank filter circulation filter 2161, see FIG. 4), a filter circulation system for removing particles in the electrodeposition bath held in the second electrodeposition tank 2116 to make the bath clean (a piping system connected to a second electrodeposition tank filter circulation filter 2263, see FIG. 5), a piping system for sending bath-stirring compressed air to both the first electrodeposition tank 2066 and the second electrodeposition tank 2116 (a piping system extending from a compressed air feed inlet 2182, see FIG. 6), a pure-water shower tank 2360 in which the continuous-length substrate on which the electrodeposition film has been deposited is washed with a pure-water shower, a first hot-water tank (here is called "hot water" since hot water is used for the pure water of a rinsing tank) 2361 in which first pure-water rinsing is carried out, a second hot-water tank 2362 in which second pure-water rinsing is carried out, a pure-water heating tank 2339 from which necessary pure-water hot water is fed to these hot-water tanks, a drying section 2363 which dries the continuous-length substrate with film (film-deposited substrate) after it has been washed, a wind-up unit 2296 for winding again into a coil the continuous-length substrate on which film deposition has been completed, and an exhaust system for discharging water vapor generated at the stage of heating the electrodeposition bath or pure water and at the stage of drying (an exhaust system constituted of an electrodeposition water washing system exhaust duct 2020, see FIGS. 4 and 5, or a drying system exhaust duct 2370, see FIG. 7).

The continuous-length substrate is transported on from the left to the right as viewed in the drawing, in the order of the wind-off unit 2012, the first electrodeposition tank 2066, the second electrodeposition tank 2116, the pure-water shower tank 2360, the first hot-water tank 2361, the second hot-water tank 2362, the drying section 2363 and the wind-up unit 2296, so that a stated electrodeposition film is deposited.

Figure 3:
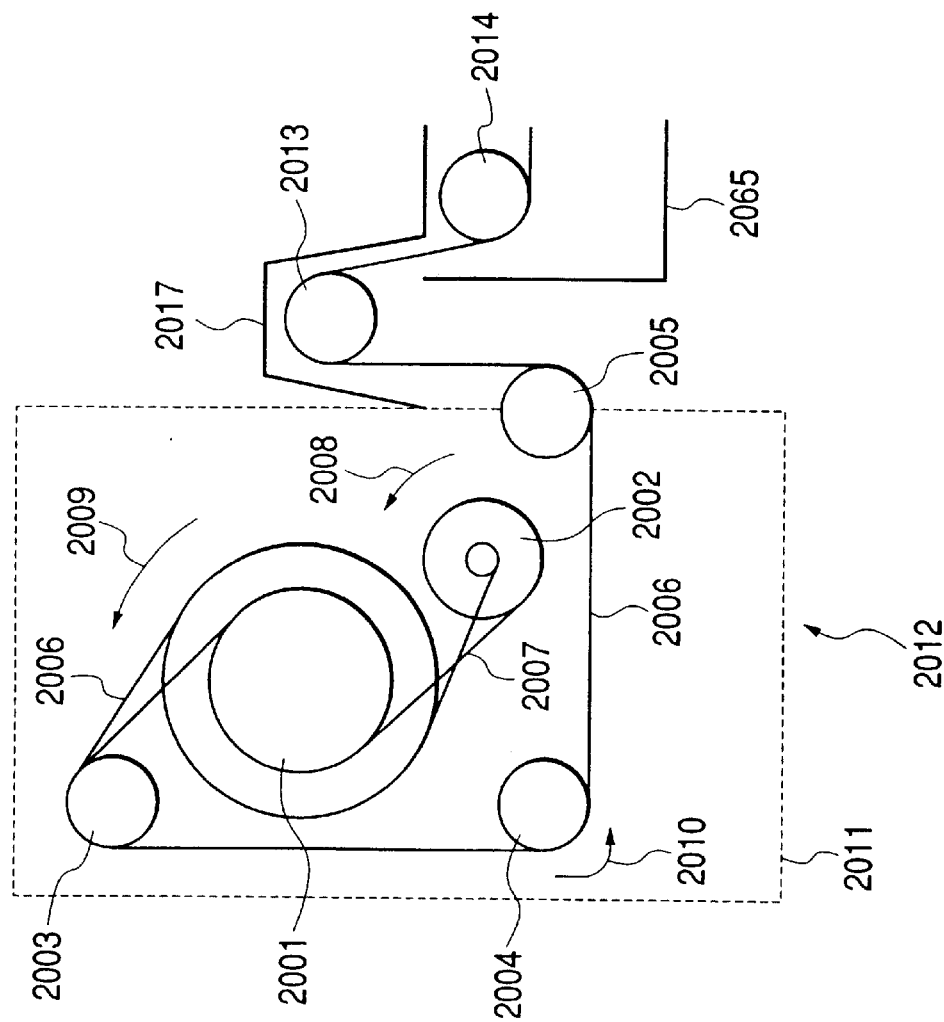
FIGS. 3, 4, 5, 6, 7 and 8 are partially enlarged views of the apparatus cross-sectionally illustrated in FIG. 2.

In the wind-off unit 2012, as shown in FIG. 3 a continuous-length substrate 2006 wound into a coil on a continuous-length substrate bobbin 2001 is set, and the continuous-length substrate 2006 is wound off through a feed control roller 2003, a direction-changing roller 2004 and a delivery roller 2005 in this order. Especially where a subbing layer has been deposited on the coil-shaped continuous-length substrate, the substrate is supplied in the form where an interleaf (interleaving paper) has been rolled up so that the substrate or layer can be protected. Accordingly, in the case where the interleaf has been rolled up, an interleaf 2007 is wound up on an interleaf wind-up bobbin 2002 as the continuous-length substrate is wound off.

The direction in which the continuous-length substrate 2006 is transported is shown by an arrow 2010, the direction in which the continuous-length substrate bobbin 2001 is rotated is shown by an arrow 2009, and the direction in which the interleaf wind-up bobbin 2002 is wound up is shown by an arrow 2008.

FIG. 3 shows that the continuous-length substrate delivered from the continuous-length substrate bobbin 2001 and the interleaf wound up on the interleaf wind-up bobbin 2002 are not interfered with each other at the transport-starting position and the transport-ending position.

For the purpose of dust-proofing, the whole wind-off unit is so structured as to be covered with a wind-off unit clean booth 2011 making use of a HEPA (high-frequency particulate air) filter and a down flow.

The first electrodeposition tank 2066 comprises, as shown in FIG. 4, a first electrodeposition bath holder tank 2065 which is not corrosive against the electrodeposition bath and can keep the temperature of the electrodeposition bath, and in that tank a temperature-controlled electrodeposition bath is so held as to have a first electrodeposition bath surface 2025. The position of this bath surface is realized by an over flow attributable to a partition plate provided inside the first electrodeposition bath holder tank 2065. The partition plate (not shown) is so installed that the electrodeposition bath is let fall toward the inner-part side by the whole first electrodeposition bath holder tank 2065. The overflowed electrodeposition bath collected in tub structure in a first electrodeposition tank overflow return opening 2024 comes to the first circulation tank 2120 through a first electrodeposition tank overflow return path 2117, where the bath is heated and is circulated again into the first electrodeposition bath holder tank 2065 from a first electrodeposition tank upstream circulation jet pipe 2063 and a first electrodeposition tank downstream circulation jet pipe 2064 (not shown) to form an inflow of the electrodeposition bath in a quantity enough for prompting the overflow.

The continuous-length substrate 2006 is passed through the inside of the first electrodeposition tank 2066 via an electrodeposition tank entrance turn-back roller 2013 (see FIG. 3), a first electrodeposition tank approach roller 2014, a first electrodeposition tank withdrawal roller 2015 and an electrodeposition tank-to-tank turn-back roller 2016. Between the first electrodeposition tank approach roller 2014 and the first electrodeposition tank withdrawal roller 2015, at least the film-forming side underside surface (often called "surface side" in the present specification) of the continuous-length substrate lies in the electrodeposition bath and faces twenty-four anodes 2026 to 2049. In actual electrodeposition, negative potential is applied to the continuous-length substrate and positive potential to the anodes, and electrodeposition electric current which causes electrochemical reaction concurrently is flowed across the both in the electrodeposition bath to effect electrodeposition.

In the present apparatus, the anodes 2026 to 2049 in the first electrodeposition tank 2066 are four by four placed on six anode stands 2054 to 2059. The anode stands are so structured that the respective anodes are placed thereon through insulating plates, and are so made that individual potential is applied from independent power sources. Also, the anode stands 2054 to 2059 have the function to keep distance between the continuous-length substrate 2006 and the anodes 2026 to 2049 in the electrodeposition bath. Accordingly, in usual cases, the anode stands 2054 to 2059 are so designed and produced that their height is adjustable to keep a predetermined distance between the both.

A first electrodeposition tank back-side film adhesion preventive electrode 2061 provided immediately at the rear of the final-positioned anode 2049 is an anode for electrochemically removing any film deposited unwantedly in the bath on the continuous-length substrate on its side opposite to the film-forming side (often called "back side" in the present specification). This is materialized by bringing the back-side film adhesion preventive electrode 2061 to a negative-side potential with respect to the continuous-length substrate. Whether or not the back-side film adhesion preventive electrode 2061 has its effect actually is confirmable by visually observing that a film of the same materials as the film formed on the film-forming side of the continuous-length substrate is fast removed on and on, which adheres electrochemically to the back, the side opposite to the film-forming side of the continuous-length substrate, because of come-around of an electric field.

A first electrodeposition tank fallen-particle removal mechanism 2060 according to the present invention, provided immediately at the rear of the first electrodeposition tank back-side film adhesion preventive electrode 2061, removes particles having fallen on the continuous-length substrate 2006, before the particles pass the first electrodeposition tank withdrawal roller 2015, thus any impact marks can be prevented from occurring when the fallen particles pass the first electrodeposition tank withdrawal roller 2015.

On the film-deposited continuous-length substrate having passed the first electrodeposition tank withdrawal roller 2015 and having come out of the electrodeposition bath, the electrodeposition bath is sprayed from a first electrodeposition tank exit shower 2067 to prevent the film-formed surface from drying to cause unevenness. Also, an electrodeposition tank-to-tank cover 2019 provided at a crossover portion between the first electrodeposition tank 2066 and the second electrodeposition tank 2116 entraps the vapor generated from the electrodeposition bath, to prevent the film-formed surface of the continuous-length substrate from drying. Still also, a second electrodeposition tank entrance shower 2068 likewise acts to prevent it from drying.

The first circulation tank 2120 functions to heat the electrodeposition bath fed into the first electrodeposition tank 2066 to keep its temperature and jet-circulate it. As described previously, the electrodeposition bath having overflowed from the first electrodeposition tank 2066 is collected at the overflow return opening 2024, then passes the overflow return path 2117, and comes to a first circulation tank heating and holding tank 2121 via a first electrodeposition tank overflow return path insulating flange 2118. Inside the first circulation tank heating and holding tank 2121, eight heaters 2122 to 2129 are provided, and are made to function when a room-temperature electrodeposition bath is initially heated or when the electrodeposition bath having come to have a low bath temperature as a result of circulation is again heated to keep the electrodeposition bath at a stated temperature.

Two circulation systems are connected to the first circulation tank heating and holding tank 2121. More specifically, they are a first electrodeposition tank upstream circulation flow-back system through which the electrodeposition bath returns from the first electrodeposition tank upstream circulation jet pipe 2063 to the first electrodeposition bath holder tank 2065 via an upstream circulation main valve 2130, an upstream circulation pump 2132, an upstream circulation valve 2135, an upstream circulation flexible pipe 2136 and an upstream circulation flange insulating pipe 2137, and a first electrodeposition tank downstream circulation flow-back system through which the electrodeposition bath returns from the first electrodeposition tank downstream circulation jet pipe 2064 to the first electrodeposition bath holder tank 2065 via a downstream circulation main valve 2139, a downstream circulation pump 2142, a downstream circulation valve 2145, a downstream circulation flexible pipe 2148 and a downstream circulation flange insulating pipe 2149.

The electrodeposition bath which returns from the upstream circulation jet pipe 2063 and downstream circulation jet pipe 2064 to the first electrodeposition tank 2066 is circulated so that the electrodeposition bath can effectively be exchanged in the first electrodeposition bath holder tank 2065, and is circulated as jets from the upstream circulation jet pipe 2063 and downstream circulation jet pipe 2064 provided at a lower part of the first electrodeposition bath holder tank 2065, through orifices bored in their respective jet pipes.

The amount of flowing back of each circulation flow-back system is chiefly controlled by the degree at which the upstream circulation valve 2135 or downstream circulation valve 2145 is opened or closed, and is more delicately controllable by an upstream circulation pump by-pass valve 2133 or a downstream circulation pump by-pass valve 2141, which is provided in a by-pass system connected by by-passing the upstream circulation pump 2132 or downstream circulation pump 2142 at its exit and entrance. Such by-pass systems also have the function to prevent any cavitation in the pumps when the electrodeposition bath is circulated in a small quantity or has a bath temperature very close to the boiling point. The cavitation which may make the bath solution boil to vaporize to make any liquid unfeedable may shorten the lifetime of pumps greatly.

When orifices are bored in the first electrodeposition tank upstream circulation jet pipe 2063 and first electrodeposition tank downstream circulation jet pipe 2064 to form jets, the amount of flowing back almost depends on the pressure of the solution returned to the upstream circulation jet pipe 2063 and downstream circulation jet pipe 2064. To know this pressure, a first electrodeposition tank electrodeposition bath upstream circulation pressure gauge 2134 and a first electrodeposition tank electrodeposition bath downstream circulation pressure gauge 2143 are provided so that the balance of the amount of flowing back can be known by these pressure gauges. Stated accurately, the quantity of flowed-back bath solution jetted from the orifices follows the Bernouilli theorem. When, however, the orifices bored in the jet pipes are several millimeters in diameter, the jet quantity can be made substantially constant over the whole first electrodeposition tank upstream circulation jet pipe 2063 or first electrodeposition tank downstream circulation jet pipe 2064.

When also the amount of flowing back is sufficiently large, the bath can be exchanged very smoothly. Hence, even when the first electrodeposition tank 2066 is fairly long, making bath concentration uniform and making temperature uniform can effectively be achieved. As a matter of course, the first electrodeposition tank overflow return path 2117 should have a diameter large enough for the bath to be flowed back in a sufficient quantity.

The upstream circulation flexible pipe 2136 and the downstream circulation flexible pipe 2148, which are provided in the respective circulation flow-back systems, absorb any strain of piping systems, and are effective especially when flange insulating piping which tends to have an insufficient mechanical strength is used.

The upstream circulation flange insulating pipe 2137 and the downstream circulation flange insulating pipe 2149, which are provided in the respective circulation flow-back systems, make the first circulation tank 2120 and first electrodeposition tank 2066 electrically float together with the first electrodeposition tank overflow return path insulating flange 2118, provided in the course of the first electrodeposition tank overflow return path 2117. This is based on the present inventor's findings that the breaking off of formation of unauthorized electric-current paths, i.e., the prevention of stray electric current leads to stable and effective procedure of the electrochemical film-forming reaction that utilizes electrodeposition electric current.

The other circulation flow-back system is provided with a by-pass flow-back system which returns directly to the second circulation tank heating and holding tank 2223 and comprises a by-pass circulation flexible pipe 2146 and a by-pass circulation valve 2147. This is used when the bath should be circulated without circulating the bath solution to the first electrodeposition tank 2066, e.g., when the bath temperature is raised from room temperature to a stated temperature.

The other circulation flow-back system extending from the first circulation tank 2120 is also provided with a solution feed system which passes the first electrodeposition tank withdrawal roller 2015 and extends to the first electrodeposition tank exit shower 2067. It extends to the first electrodeposition tank exit shower 2067 via a first electrodeposition tank exit shower valve 2150. The amount of the electrodeposition solution sprayed from the exit shower 2067 is regulated by controlling the degree of opening or closing the exit shower valve 2150.

The first circulation tank heating and holding tank 2121 is actually provided with a cover to provide a structure that can prevent the bath from vaporizing to lose water. When the bath has a high temperature, the cover also comes to have a high temperature, and hence it should be taken into consideration to, e.g., attach a heat insulation material. This is necessary in view of the safety of operation.

In order to remove particles floating in the first electrodeposition tank electrodeposition bath, a filter circulation system is provided. A filter circulation system for the first electrodeposition tank 2066 consists of a filter circulation return flexible pipe 2151, a filter circulation return flange insulating pipe 2152, a filter circulation main valve 2154, a filter circulation suction filter 2156, a filter circulation pump 2157, a filter circulation pump by-pass valve 2158, a filter circulation pressure switch 2159, a filter circulation pressure gauge 2160, a filter circulation filter 2161, a filter circulation flexible pipe 2164, a filter circulation flange insulating pipe 2165, a filter circulation valve 2166, a filter circulation system electrodeposition bath upstream return valve 2167, a filter circulation system electrodeposition bath midstream return valve 2168 and a filter circulation system electrodeposition bath downstream return valve 2169. Through this course, the electrodeposition bath flows in the direction of first electrodeposition tank filter circulation directions 2155, 2162 and 2163. The particles to be removed may originate from powder brought in from the outside of the system or may be formed on the electrode surface or in the bath, depending on electrodeposition reaction. Minimum size of the particles to be removed depends on the filter size of the filter circulation filter 2161.

The filter circulation return flexible pipe 2151 and the filter circulation flexible pipe 2164 are pipes for absorbing any strain of piping systems to minimize any liquid leakage from pipe-connected portions and also protect the insulating pipe inferior in mechanical strength so that the constituent parts of the circulation system which includes pumps can be disposed at a greater degree of freedom.

The filter circulation return flange insulating pipe 2152 and the filter circulation flange insulating pipe 2165 are provided so that the first electrodeposition bath holder tank 2065 set floating from the ground earth can be made to float electrically to prevent it from falling to the ground earth.

The filter circulation suction filter 2156 is a wire cloth like a "tea strainer", so to speak, and is a filter for removing large foreign matter so as to protect the subsequent filter circulation pump 2157 and filter circulation filter 2161.

The filter circulation filter 2161 is the leading part of this circulation system, and is a filter for removing any particles having mixed or occurred in the electrodeposition bath.

Circulation flow rate of the electrodeposition bath in this circulation system is micro-adjusted primarily by the filter circulation valve 2166, and secondarily by the filter circulation pump by-pass valve 2158, provided in parallel to the filter circulation pump 2157. The filter circulation pressure gauge 2160 is provided in order to catch the circulation flow rate to be adjusted by these valves. The filter circulation pump by-pass valve 2158 not only micro-adjusts the flow rate but also prevents the filter circulation pump 2157 from breaking because of any cavitation which may occur when the whole filter circulation flow rate is reduced.

The electrodeposition bath can be transferred to a first waste-solution tank 2172 (see FIG. 6) through the filter circulation return flange insulating pipe 2152 via a first electrodeposition tank drain valve 2153. This transfer is made when the electrodeposition bath is replaced, when the apparatus is put to maintenance work and also on occasion of emergency. The electrodeposition bath as waste solution to be transferred is fallen by gravity-drop into a first waste-solution tank waste-solution holder tank 2144. For the purpose of maintenance work or emergency measures, the first waste-solution tank waste-solution holder tank 2144 may preferably have a capacity large enough to store the total bath volume in the first electrodeposition tank 2066 and the first circulation tank 2120.

The first waste-solution tank waste-solution holder tank 2144 is provided with a top cover 2277 and, in order to make the gravity-drop transfer of the electrodeposition bath effective, it is provided with an air vent 2171 and a first waste-solution tank air vent valve 2170.

The electrodeposition bath which has temporarily been fallen into the first waste-solution tank waste-solution holder tank 2144 is, after its temperature has lowered, sent out through a waste-solution drainage valve 2173 for drainage treatment on the side of a building, or collected in a steel drum (not shown) through a waste-solution collection valve 2174, a waste-solution collection main valve 2175, a waste-solution collection main suction filter 2176 and a waste-solution collection pump 2177 so as to be put to appropriate disposal. Before the collection or treatment, the waste solution may also be diluted with water or treated with chemicals in the waste-solution holder tank 2144.

In order to stir the electrodeposition bath to make uniform formation of the electrodeposition film, the system is so designed that air bubbles are jetted from a plurality of orifices bored in a first electrodeposition tank stirring air feed pipe 2062 (see FIG. 4) installed at the bottom of the first electrodeposition bath holder tank 2065. As air, compressed air fed to a factory is taken in from a compressed-air intake opening 2182 (see FIG. 6, too) and, through an electrodeposition bath stirring compressed-air pressure switch 2183 and in the direction shown by a compressed-air feed direction 2184, is passed through a compressed-air main valve 2185, a compressed-air flow meter 2186, a compressed-air regulator 2187, a compressed-air mist separator 2188, a compressed-air feed valve 2189, a compressed-air flexible pipe 2190, a compressed-air insulating pipe 2191 and a compressed-air upstream-side control valve 2193 or a compressed-air downstream-side control valve 2192 in order, and is led to the first electrodeposition tank stirring air feed pipe 2062.

The film-deposited continuous-length substrate transported to the second electrodeposition tank 2116 (see FIG. 5) through the electrodeposition tank-to-tank turn-back roller 2016 is subjected to deposition of a second electrodeposited film or to some treatment. Depending on the manner of use of the present apparatus, the second electrodeposited film may be the same as the first electrodeposited film and the first and second electrodeposited films may make up one film. Alternatively, the two layers may make up a stacked layer of two layers formed of the same material but endowed with different properties (e.g., a stacked layer of layers formed of the same zinc oxide but having different particle diameters), or a stacked layer of two layers having the same properties but formed of different properties (e.g., a stacked layer of a zinc indium layer as a transparent conductive layer and a zinc oxide layer), or a stacked layer of entirely different layers. Still alternatively, a low oxide may be deposited in the first electrodeposition tank 2066 and its oxidation-promoting treatment may be made in the second electrodeposition tank 2116, or a low oxide may be deposited in the first electrodeposition tank 2066 and its etching treatment may be made in the second electrodeposition tank 2116. Such combinations are possible. Accordingly, electrodeposition or treatment conditions such as electrodeposition bath, bath temperature, bath circulation quantity, electric-current density and stirring rate may be selected according to the corresponding purposes. When electrodeposition or treatment time must be made different between the first electrodeposition tank 2066 and the second electrodeposition tank 2116, the time for which the continuous-length substrate 2006 is passed may be made different between the first electrodeposition tank 2066 and the second electrodeposition tank 2116. To make such time different, it may be regulated by making tank length different between the first electrodeposition tank 2066 and the second electrodeposition tank 2116, or by making the continuous-length substrate turn back.

The second electrodeposition tank 2116 comprises, as shown in FIG. 5, a second electrodeposition bath holder tank 2115 which is not corrosive against the electrodeposition bath and can keep the temperature of the electrodeposition bath, and in that tank a temperature-controlled electrodeposition bath is so held as to have a second electrodeposition bath surface 2074. The position of this bath surface is realized by an over flow attributable to a partition plate provided inside the second electrodeposition bath holder tank 2115. The partition plate (not shown) is so installed that the electrodeposition bath is let fall toward the inner-part side by the whole second electrodeposition bath holder tank 2115. The overflowed electrodeposition bath collected in tub structure in a second electrodeposition tank overflow return opening 2075 comes to the second circulation tank 2222 through a second electrodeposition tank overflow return path 2219, where the bath is heated and is circulated again into the second electrodeposition bath holder tank 2115 from a second electrodeposition tank upstream circulation jet pipe 2113 and a second electrodeposition tank downstream circulation jet pipe 2114 to form an inflow of the electrodeposition bath in a quantity enough for prompting the overflow.

The film-deposited continuous-length substrate 2006 is passed through the inside of the second electrodeposition tank 2116 via the electrodeposition tank-to-tank turn-back roller 2016, a second electrodeposition tank approach roller 2069, a second electrodeposition tank withdrawal roller 2070 and a pure-water shower tank turn-back approach roller 2279. Between the second electrodeposition tank approach roller 2069 and the second electrodeposition tank withdrawal roller 2070, the surface side of the continuous-length substrate lies in the electrodeposition bath and faces twenty-four anodes 2076 to 2099. In actual electrodeposition, negative potential is applied to the continuous-length substrate and positive potential to the anodes, and electrodeposition electric current which causes electrochemical reaction concurrently is flowed across the both in the electrodeposition bath to effect electrodeposition.

In the present apparatus, the anodes 2076 to 2099 in the second electrodeposition tank 2116 are four by four placed on six anode stands 2104 to 2109. The anode stands are so structured that the respective anodes are placed thereon through insulating plates, and are so made that individual potential is applied from independent power sources. Also, the anode stands 2104 to 2109 have the function to keep distance between the continuous-length substrate 2006 and the anodes 2076 to 2099 in the electrodeposition bath. Accordingly, in usual cases, the anode stands 2104 to 2109 are so designed and produced that their height is adjustable to keep a predetermined distance between the both.

A second electrodeposition tank back-side film adhesion preventive electrode 2111 provided immediately at the rear of the second electrodeposition tank final-positioned anode 2099 is an anode for electrochemically removing any film deposited unwontedly in the bath on the back side of the continuous-length substrate on. This is materialized by bringing the second electrodeposition tank back-side film adhesion preventive electrode 2111 to a negative-side potential with respect to the continuous-length substrate. Whether or not the second electrodeposition tank back-side film adhesion preventive electrode 2111 has its effect actually is confirmable by visually observing that a film of the same materials as the film formed on the film-forming side of the continuous-length substrate is fast removed on and on, which adheres electrochemically to the back side, the side opposite to the film-forming side of the continuous-length substrate, because of come-around of an electric field.

A second electrodeposition tank fallen-particle removal mechanism 2110 according to the present invention, provided immediately at the rear of the second electrodeposition tank back-side film adhesion preventive electrode 2111, removes particles having fallen on the continuous-length substrate 2006, before the particles pass the second electrodeposition tank withdrawal roller 2070, thus any impact marks can be prevented from occurring when the fallen particles pass the second electrodeposition tank withdrawal roller 2070.

On the film-deposited continuous-length substrate having passed the second electrodeposition tank withdrawal roller 2070 and having come out of the electrodeposition bath, the electrodeposition bath is sprayed from a second electrodeposition tank exit shower 2297 to prevent the film-formed surface from drying to cause unevenness. Also, a pure-water shower tank turn-back approach roller cover 2318 provided at a cross-over portion between the second electrodeposition tank 2116 and a pure-water shower tank 2360 entraps the vapor generated from the electrodeposition bath, to prevent the film-formed surface of the continuous-length substrate from drying. Still also, a pure-water shower tank entrance surface-side pure-water shower 2299 and a pure-water shower tank entrance back-side pure-water shower 2300 (see FIG. 7) not only wash off the electrodeposition bath but also function likewise.

The second circulation tank 2222 functions to heat the electrodeposition bath fed into the second electrodeposition tank 2116 to keep its temperature and jet-circulate it. As described previously, the electrodeposition bath having overflowed from the second electrodeposition tank 2116 is collected at the overflow return opening 2075, then passes the overflow return path 2219, and comes to a second circulation tank heating and holding tank 2223 via a second electrodeposition tank overflow return path insulating flange 2220. Inside the second circulation tank heating and holding tank 2223, eight heaters 2224 to 2231 are provided, and are made to function when a room-temperature electrodeposition bath is initially heated or when the electrodeposition bath having come to have a low bath temperature as a result of circulation is again heated to keep the electrodeposition bath at a stated temperature.

Two circulation systems are connected to the second circulation tank heating and holding tank 2223. More specifically, they are a second electrodeposition tank upstream circulation flow-back system through which the electrodeposition bath returns from the second electrodeposition tank upstream circulation jet pipe 2113 to the second electrodeposition bath holder tank 2115 via an upstream circulation main valve 2232, an upstream circulation pump 2234, an upstream circulation valve 2237, an upstream circulation flexible pipe 2238 and an upstream circulation flange insulating pipe 2239, and a second electrodeposition tank downstream circulation flow-back system through which the electrodeposition bath returns from the second electrodeposition tank downstream circulation jet pipe 2114 to the second electrodeposition bath holder tank 2115 via a downstream circulation main valve 2242, a downstream circulation pump 2245, a downstream circulation valve 2247, a downstream circulation flexible pipe 2248 and a downstream circulation flange insulating pipe 2249.

The electrodeposition bath which returns from the upstream circulation jet pipe 2113 and downstream circulation jet pipe 2114 to the second electrodeposition tank 2116 is circulated so that the electrodeposition bath can effectively be exchanged in the second electrodeposition bath holder tank 2115, and is circulated as jets from the upstream circulation jet pipe 2113 and downstream circulation jet pipe 2114 provided at a lower part of the second electrodeposition bath holder tank 2115, through orifices bored in their respective jet pipes.

The amount of flowing back of each circulation flow-back system is chiefly controlled by the degree at which the upstream circulation valve 2237 or downstream circulation valve 2247 is opened or closed, and is more delicately controllable by an upstream circulation pump by-pass valve 2235 or a downstream circulation pump by-pass valve 2244, which is provided in a by-pass system connected by by-passing the upstream circulation pump 2234 or downstream circulation pump 2245 at its exit and entrance. Such by-pass systems also have the function to prevent any cavitation in the pumps when the electrodeposition bath is circulated in a small quantity or has a bath temperature very close to the boiling point. The cavitation which, as also stated in the description of the first electrodeposition tank 2066, may make the bath solution boil to vaporize to make any liquid unfeedable may shorten the lifetime of pumps greatly.

When orifices are bored in the second electrodeposition tank upstream circulation jet pipe 2113 and second electrodeposition tank downstream circulation jet pipe 2114 to form jets, the amount of flowing back almost depends on the pressure of the solution returned to the upstream circulation jet pipe 2113 and downstream circulation jet pipe 2114. To know this pressure, a second electrodeposition tank electrodeposition bath upstream circulation pressure gauge 2236 and a second electrodeposition tank electrodeposition bath downstream circulation pressure gauge 2246 are provided so that the balance of the amount of flowing back can be known by these pressure gauges. Stated accurately, the quantity of flowed-back bath solution jetted from the orifices follows the Bernouilli theorem. When, however, the orifices bored in the jet pipes are several millimeters in diameter, the jet quantity can be made substantially constant over the whole second electrodeposition tank upstream circulation jet pipe 2113 or second electrodeposition tank downstream circulation jet pipe 2114.

When also the amount of flowing back is sufficiently large, the bath can be exchanged very smoothly. Hence, even when the second electrodeposition tank 2116 is fairly long, making bath concentration uniform and making temperature uniform can effectively be achieved. As a matter of course, the second electrodeposition tank overflow return path 2219 should have a diameter large enough for the bath to be flowed back in a sufficient quantity.

The upstream circulation flexible pipe 2238 and the downstream circulation flexible pipe 2248, which are provided in the respective circulation flow-back systems, absorb any strain of piping systems, and are effective especially when flange insulating piping which tends to have an insufficient mechanical strength is used.

The upstream circulation flange insulating pipe 2239 and the downstream circulation flange insulating pipe 2249, which are provided in the respective circulation flow-back systems, make the second circulation tank 2222 and second electrodeposition tank 2116 electrically float together with the second electrodeposition tank overflow return path insulating flange 2220, provided in the course of the second electrodeposition tank overflow return path 2219. This is based on the present inventors' findings that the breaking off of formation of unauthorized electric-current paths, i.e., the prevention of stray electric current leads to stable and effective procedure of the electrochemical film-forming reaction that utilizes electrodeposition electric current.

The other circulation flow-back system is provided with a by-pass flow-back system which returns directly to the second circulation tank heating and holding tank 2223 and comprises a by-pass circulation flexible pipe 2250 and a by-pass circulation valve 2251. This is used when the bath should be circulated without circulating the bath solution to the second electrodeposition tank 2116, e.g., when the bath temperature is raised from room temperature to a stated temperature.

Both the circulation flow-back systems extending from the second circulation tank 2222 are also provided with two solution feed systems, one of which send the electrodeposition bath to a second electrodeposition tank entrance shower 2068 which sprays the bath on the film-deposited continuous-length substrate immediately before it reaches the second electrodeposition tank approach roller 2069, and the other of which send the electrodeposition bath to a second electrodeposition tank exit shower 2297 which sprays the bath on the film-deposited continuous-length substrate having passed the second electrodeposition tank withdrawal roller 2075 (not shown) to have come out of the electrodeposition bath. The former extends to the second electrodeposition tank entrance shower 2068 via a second electrodeposition tank entrance shower valve 2241, and the latter extends to the second electrodeposition tank exit shower 2297 via a second electrodeposition tank exit shower valve 2252. The amount of the electrodeposition solution sprayed from the entrance shower 2068 is regulated by controlling the degree of opening or closing the entrance shower valve 2241, and the amount of the electrodeposition solution sprayed from the exit shower 2297 is regulated by controlling the degree of opening or closing the exit shower valve 2252.

The second circulation tank heating and holding tank 2223 is actually provided with a cover to provide a structure that can prevent the bath from vaporizing to lose water. When the bath has a high temperature, the cover also comes to have a high temperature, and hence it should be taken into consideration to, e.g., attach a heat insulation material. This is necessary in view of the safety of operation.

In order to remove particles floating in the second electrodeposition tank electrodeposition bath, a filter circulation system is provided. A filter circulation system for the second electrodeposition tank 2116 consists of a filter circulation return flexible pipe 2253, a filter circulation return flange insulating pipe 2254, a filter circulation main valve 2256, a filter circulation suction filter 2258, a filter circulation pump 2260, a filter circulation pump by-pass valve 2259, a filter circulation pressure switch 2261, a filter circulation pressure gauge 2262, a filter circulation filter 2263, a filter circulation flexible pipe 2266, a filter circulation flange insulating pipe 2267, a filter circulation valve 2268, a filter circulation system electrodeposition bath upstream return valve 2269, a filter circulation system electrodeposition bath midstream return valve 2270 and a filter circulation system electrodeposition bath downstream return valve 2271. Through this course, the electrodeposition bath flows in the direction of second electrodeposition tank filter circulation directions 2257, 2264 and 2265. The particles to be removed may originate from powder brought in from the outside of the system or may be formed on the electrode surface or in the bath, depending on electrodeposition reaction. Minimum size of the particles to be removed depends on the filter size of the filter circulation filter 2263.

The filter circulation return flexible pipe 2253 and the filter circulation flexible pipe 2266 are pipes for absorbing any strain of piping systems to minimize any liquid leakage from pipe-connected portions and also protect the insulating pipe inferior in mechanical strength so that the constituent parts of the circulation system which includes pumps can be disposed at a greater degree of freedom.

The filter circulation return flange insulating pipe 2254 and the filter circulation flange insulating pipe 2267 are provided so that the second electrodeposition bath holder tank 2115 set floating from the ground earth can be made to float electrically to prevent it from falling to the ground earth.

The filter circulation suction filter 2258 is a wire cloth like a "tea strainer", so to speak, and is a filter for removing large foreign matter so as to protect the subsequent filter circulation pump 2260 and filter circulation filter 2263.

The filter circulation filter 2263 is the leading part of this circulation system, and is a filter for removing any particles having mixed or occurred in the electrodeposition bath.

Circulation flow rate of the electrodeposition bath in this circulation system is micro-adjusted primarily by the filter circulation valve 2268, and secondarily by the filter circulation pump by-pass valve 2259, provided in parallel to the filter circulation pump 2260. The filter circulation pressure gauge 2262 is provided in order to catch the circulation flow rate to be adjusted by these valves. The filter circulation pump by-pass valve 2259 not only micro-adjusts the flow rate but also prevents the filter circulation pump 2260 from breaking because of any cavitation which may occur when the whole filter circulation flow rate is reduced.

The electrodeposition bath can be transferred to a second waste-solution tank 2274 (see FIG. 6) through the filter circulation return flange insulating pipe 2254 via a second electrodeposition tank drain valve 2255. This transfer is made when the electrodeposition bath is replaced, when the apparatus is put to maintenance work and also on occasion of emergency. The electrodeposition bath as waste solution to be transferred is fallen by gravity-drop into a second waste-solution tank waste-solution holder tank 2273. For the purpose of maintenance work or emergency measures, the second waste-solution tank waste-solution holder tank 2273 may preferably have a capacity large enough to store the total bath volume in the second electrodeposition tank 2116 and the second circulation tank 2222.

The second waste-solution tank waste-solution holder tank 2273 is provided with a top cover 2278 and, in order to make the gravity-drop transfer of the electrodeposition bath effective, it is provided with an air vent 2276 and a second waste-solution tank air vent valve 2275.

The electrodeposition bath which has temporarily been fallen into the second waste-solution tank waste-solution holder tank 2273 is, after its temperature has lowered, sent out through a waste-solution drainage valve 2180 for drainage treatment on the side of a building, or collected in a steel drum (not shown) through a waste-solution collection valve 2181, a waste-solution collection main valve 2175, a waste-solution collection main suction filter 2176 and a waste-solution collection pump 2177 so as to be put to appropriate disposal. Before the collection or treatment, the waste solution may also be diluted with water or treated with chemicals in the waste-solution holder tank 2273.

In order to stir the electrodeposition bath to make uniform formation of the electrodeposition film, the system is so designed that air bubbles are jetted from a plurality of orifices bored in a second electrodeposition tank stirring air feed pipe 2112 (see FIG. 5) installed at the bottom of the second electrodeposition bath holder tank 2115. As air, compressed air fed to a factory is taken in from a compressed-air intake opening 2182 (see FIG. 6, too) and, through an electrodeposition bath stirring compressed-air pressure switch 2183 and in the direction shown by a compressed-air feed direction 2194, is passed through a compressed-air main valve 2195, a compressed-air flow meter 2196, a compressed-air regulator 2197, a compressed-air mist separator 2198, a compressed-air feed valve 2199, a compressed-air flexible pipe 2200, a compressed-air insulating pipe 2201 and a compressed-air upstream-side control valve 2202 or a compressed-air downstream-side control valve 2272 in order, and is led to the second electrodeposition tank stirring air feed pipe 2112.

In the first electrodeposition tank 2066 and second electrodeposition tank 2116, as shown in FIG. 6 a preliminary feed system is installed so that a preliminary liquid or gas can be fed in. Liquid or gas having entered from an electrodeposition tank preliminary feed inlet 2213 is fed via an electrodeposition tank preliminary feed valve 2214, into the first electrodeposition tank 2066 through a first electrodeposition tank preliminary feed valve 2215 (not shown) and a first electrodeposition tank preliminary feed insulating pipe 2216 (not shown), and also into the second electrodeposition tank 2116 through a second electrodeposition tank preliminary feed valve 2217 and a second electrodeposition tank preliminary feed insulating pipe 2218. In the preliminary feed system, those having the highest possibility of being fed in are retaining agents or replenishing chemicals which are used for keeping the ability of the bath constant for a long time. In some cases, they may be gases to be dissolved in the bath or acids capable of removing the particles.

The rinsing is carried out through three stages of a pure-water shower tank 2360, a first hot-water tank 2361 and a second hot-water tank 2362 as shown in FIG. 7. Its system is so constructed that heated pure water is fed to the second hot-water tank 2362, and its waste liquor is used in the first hot-water tank 2361, and further its waste liquor is used in the pure-water shower tank 2360. Thus, after the electrodeposition in the electrodeposition tanks has been completed, the film-deposited continuous-length substrate is washed on with water having purities stepwise made higher.

Figure 8:
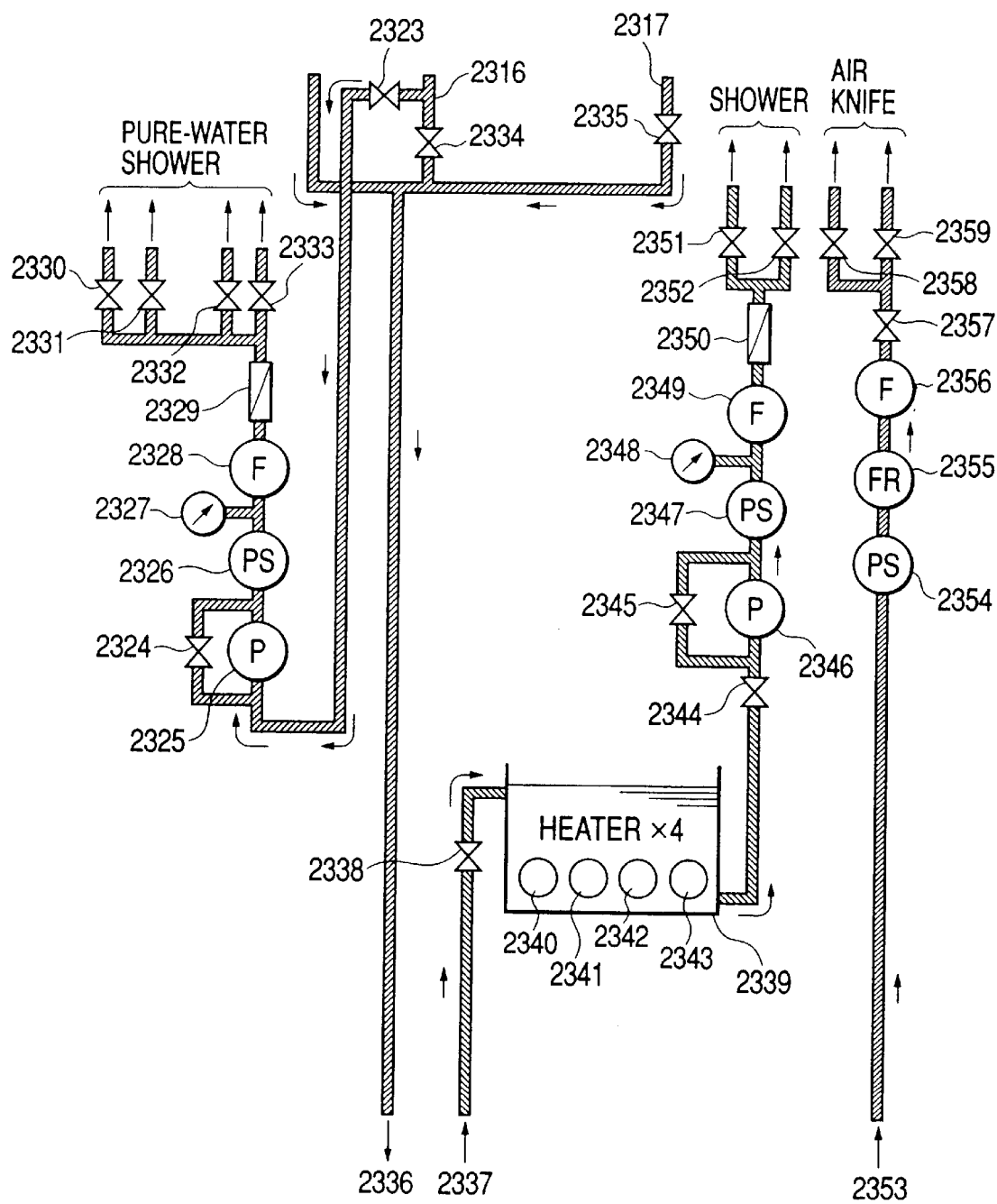

This pure water is fed to a second hot-water tank exit back-side pure-water shower 2309 and a second hot-water tank exit surface-side pure-water shower 2310. The pure water to be fed is, as shown in FIG. 8, temporarily stored in a pure-water heating tank 2339 from a water washing system pure-water inlet 2337 through a water washing system pure-water feed main valve 2338, then heated to a predetermined temperature by means of pure-water heaters 2340 to 2343, and then passed through a pure-water delivery valve 2344, a pure-water delivery pump 2346, a tank pressure switch 2347, a cartridge type filter 2349 and a flow meter 2350. Then the pure water is on the one hand led through a second hot-water tank exit back-side shower valve 2351 to the second hot-water tank exit back-side pure-water shower 2309 (FIG. 7) and on the other hand led through a second hot-water tank exit surface-side shower valve 2352 to the second hot-water tank exit surface-side pure-water shower 2310 (FIG. 7). The heating is in order to improve cleaning effect.

The pure water fed to the showers and collected in a second hot-water tank hot-water holding tank 2317 forms a pure-water rinsing bath, and the film-deposited continuous-length substrate is washed with still water. In the second hot-water tank 2362, a hot-water warming heater 2307 is provided so that the temperature of the pure water does not drop.

To the first hot-water tank 2361, pure water having overflowed the second hot-water tank hot-water holding tank 2317 is fed from the second hot-water tank 2362 via a hot-water tank-to-tank connecting pipe 2322. To the first hot-water tank 2361, like the second hot-water tank 2362, a first hot-water tank hot-water warming heater 2304 is provided so that the temperature of the pure water can be maintained. To the first hot-water tank 2361, an ultrasonic wave source 2306 is further provided so that any stains on the film-deposited continuous-length substrate surface can positively removed between a first hot-water tank roller 2282 and a second hot-water tank turn-back approach roller 2283.

In the pure-water shower tank 2360, pure water from a first hot-water tank hot-water holding tank 2316 is, subsequent to a pure-water shower feed main valve 2323, sent, as shown in FIG. 8, through a pure-water shower feed pump 2325, a pure-water shower feed pressure switch 2326, a pure-water shower feed cartridge type filter 2328 and a pure-water shower feed flow meter 2329, and is further sent from a pure-water shower tank entrance surface-side pure-water shower valve 2330 to a pure-water shower tank entrance surface-side pure-water shower 2299 (FIG. 7), from a pure-water shower tank entrance back-side pure-water shower valve 2331 to a pure-water shower tank entrance back-side pure-water shower 2300 (FIG. 7), from a pure-water shower tank exit back-side pure-water shower valve 2332 to a pure-water shower tank exit back-side pure-water shower 2302 (FIG. 7), and from a pure-water shower tank exit surface-side pure-water shower valve 2333 to a pure-water shower tank exit surface-side pure-water shower 2303 (FIG. 7), thus washing shower streams are applied to the respective film-deposited continuous-length substrate back side and surface side at the entrance and exit of the pure-water shower tank 2360.

The water having been served on showering is received in a pure-water shower tank receiving tank 2315, and, as it is, joined with part of the water in the first hot-water tank hot-water holding tank 2316 and second hot-water tank hot-water holding tank 2317, which is then discarded to a water washing system drainage 2336. Usually, the water having been served on washing contains ions and others, and must be subjected to given treatment.

In the pure-water shower tank 2360, first hot-water tank 2361 and second hot-water tank 2362, the film-deposited continuous-length substrate is forwarded to a pure-water shower tank return-back approach roller 2279, a pure-water shower tank roller 2280, a first hot-water tank return-back approach roller 2281, a first hot-water tank return-back approach roller 2281, a first hot-water tank roller 2282, a second hot-water tank return-back approach roller 2283, a second hot-water tank roller 2284 and a drying-section return-back roller 2285.

Immediately at the rear of the pure-water shower tank return-back approach roller 2279, a pure-water shower tank back-side brush 2298 is provided so that any relatively large particles or weakly adherent unauthorized products having adhered to the film-deposited continuous-length substrate back side can be removed.

The film-deposited continuous-length substrate 2006 having come to the drying section 2363 is first hydro-extracted with a drying-section entrance back-side air knife 2311 and a drying-section entrance back-side air knife 2312. To the air-knives, air is fed through the course consisting of, as shown in FIG. 8, a drying-system compressed-air feed inlet 2353, a drying-system compressed-air pressure switch 2354, a drying-system compressed-air filter regulator 2355, a drying-system compressed-air mist separator 2356, a drying-system compressed-air feed valve 2357 and then a drying-section entrance back-side air knife valve 2358 or a drying-section entrance surface-side air knife valve 2359. The air fed to the drying section 2363 may cause a difficulty especially if it contains water drops or the like. Accordingly, the role of the drying-system compressed-air mist separator 2356 is important.

In the course where the film-deposited continuous-length substrate is transported from the drying-section return-back roller 2285 to a wind-up unit approach roller 2286, it is dried by radiation heat of IR lamps arranged there. As long as the IR lamps provide sufficient radiation heat, no difficulty may occur even when the continuous-length substrate 2006 is put into a vacuum apparatus such as a CVD apparatus after the electrodeposition film has been formed thereon. At the time of drying, the hydro-extraction causes fog and the IR lamp radiation causes water vapor. Accordingly, it is indispensable to provide a drying-section exhaust vent 2314 communicating with an exhaust duct.

Figure 9:
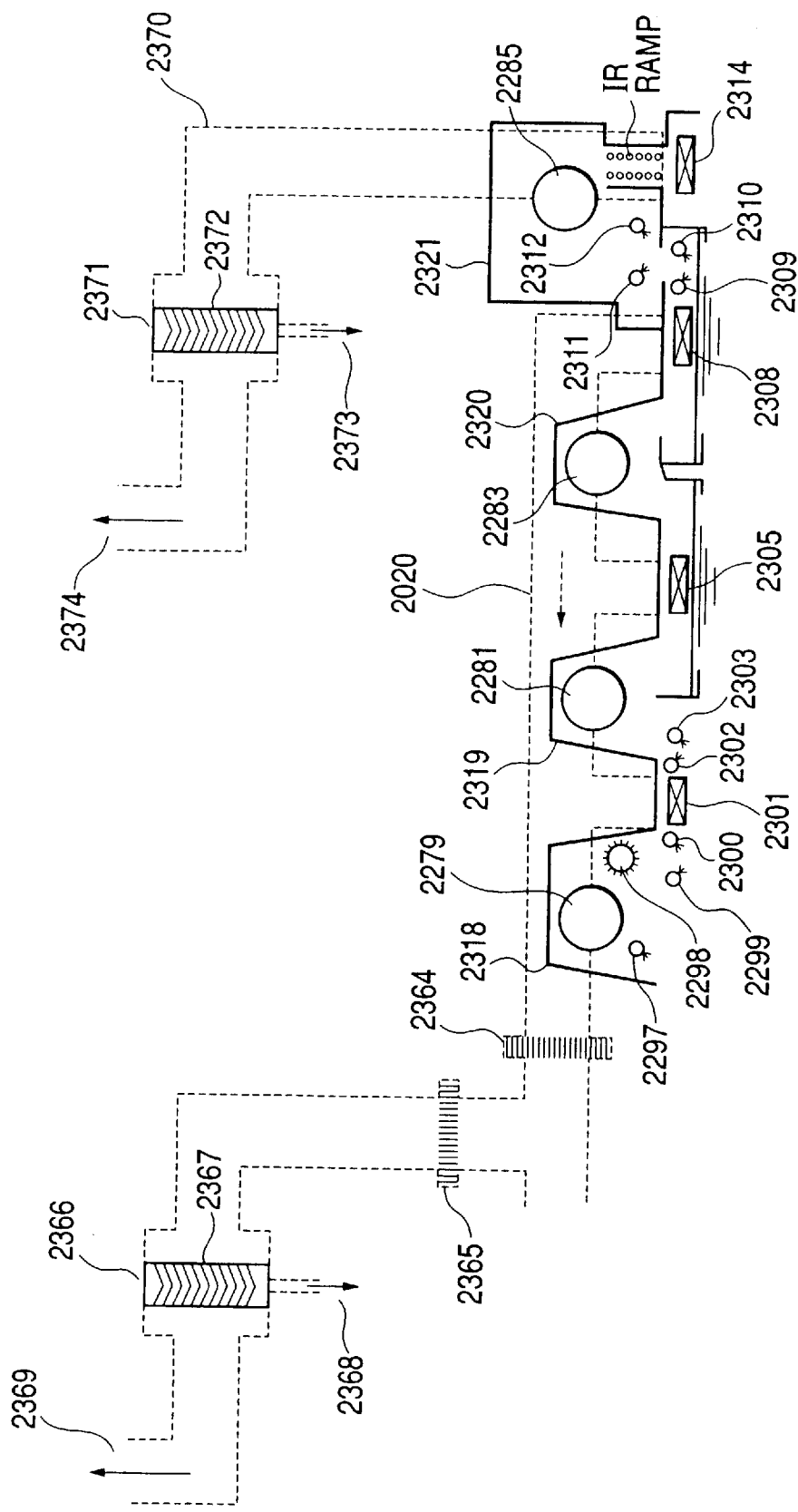
FIG. 9 is a cross-sectional illustration of an example of an exhaust duct system of the apparatus shown in FIG. 2.

The water vapor collected in a drying-system exhaust duct 2370 is, as shown in FIG. 9, almost all returned to water through a drying-system condenser 2371, which is then discarded to a drying-system condenser water drainage 2373 and is partly discarded to drying-system exhaust 2374. When the water vapor contains any harmful gases, it should be driven off after given treatment.

In the wind-up unit 2296 (see FIG. 7), the film-deposited continuous-length substrate 2006 is brought to pass an approach roller 2286, a direction change roller 2287, a wind-up regulation roller 2288 in order, and is successively wound up in a coil on a film-deposited continuous-length substrate wind-up bobbin 2289. When it is necessary to protect the deposited film, an interleaf is wound off from an interleaf wind-off bobbin 2290 and is rolled up on the film-deposited continuous-length substrate. The direction in which the film-deposited continuous-length substrate 2006 is transported is shown by an arrow 2292, the direction in which the film-deposited continuous-length substrate wind-up bobbin 2289 is rotated is shown by an arrow 2293, and the direction in which the interleaf wind-off bobbin 2290 is wound up is shown by an arrow 2294. FIG. 7 shows that the film-deposited continuous-length substrate 2006 wound up on the wind-up bobbin 2289 and the interleaf wound off from the interleaf wind-off bobbin 2290 are not interfered with each other at the transport-starting position and the transport-ending position. For the purpose of dust-proofing, the whole wind-up unit is so structured as to be covered with a clean booth 2295 making use of a HEPA filter and a down flow.

In this wind-up unit, the direction change roller 2287 is provided with the function to correct any meandering of the continuous-length substrate 2006. In accordance with signals from a meander detector provided between the direction change roller 2287 and the wind-up regulation roller 2288, the direction change roller 2287 is made to swing by a hydraulic servo around a shaft set on the side of the approach roller 2286, whereby any meandering motion can be corrected. The direction change roller 2287 is controlled by the movement of the roller approximately toward this side or the inner-part side, and the direction of its movement is opposite to the direction of detection of the meandering of the continuous-length substrate from the meander detector. Gain of the servo depends on the continuous-length substrate transport speed, and is commonly not required to be large. Even when a continuous-length substrate of hundreds of meters in length is wound up, its edge faces can be made even at a precision on a submillimetric order.

Use of the electrodeposition bath and hot water at a temperature higher than room temperature generates water vapor necessarily. In particular, their use at a temperature higher than 80° C. generates water vapor considerably. Water vapor generated from the bath surface in the tank may gather on the bath surface in the tank to come to spout strongly from gaps of the apparatus or to become released in a large quantity when the cover is opened, or it may flow down in water drops from gaps of the apparatus, to worsen operational environment of the apparatus. Accordingly, the water vapor may preferably be discharged forcedly by suction.

Water vapor is collected to the exhaust duct 2020 via an upstream exhaust vent 2021, a midstream exhaust vent 2022 and a downstream exhaust vent 2023 of the first electrodeposition tank 2066 and also an upstream exhaust vent 2071, a midstream exhaust vent 2072 and a downstream exhaust vent 2073 of the second electrodeposition tank 2116, an exhaust vent 2301 of the pure-water shower tank 2360, an exhaust vent 2305 of the first hot-water tank 2361 and an exhaust vent 2308 of the second hot-water tank 2362, and is, as shown in FIG. 9, passed through insulating flanges (2364, 2365) and almost all returned to water through an electrodeposition water washing system exhaust duct condenser 2366, which is then discarded to a condenser water drainage 2368 and is partly discarded to electrodeposition water washing system exhaust 2369. When the water vapor contains any harmful gases, it should be driven off after given treatment.

In the present apparatus, the exhaust duct 2020 is constituted of stainless steel. Accordingly, in order to bring the bath holder tank 2065 of the first electrodeposition tank 2066 and the bath holder tank 2115 of the second electrodeposition tank 2116 from the ground earth to the float potential, an electrodeposition water washing system exhaust duct key insulating flange 2365 and an electrodeposition water washing system exhaust duct water-washing-side insulating flange 2364 are provided so that the both tanks are electrically separated.

Back-side Film Adhesion Preventive Electrode

Unauthorized electrodeposition films formed on the back side are removed by means of the back-side film adhesion preventive electrode (2061 or 2111). A potential negative to the substrate is applied to the back-side film adhesion preventive electrode. Hence, it is necessary for the both to stand float-output to each other especially so as to prevent interference with a power source for the electrodeposition. Electric current of from 1 A to 60 A per back-side electrode set in one electrodeposition tank is used. As materials for the back-side film adhesion preventive electrode, usable are Ti and SUS stainless steel, capable of providing a high hydrogen overvoltage. Electrodeposits such as zinc oxide stripped from the back side of the substrate and collected at the back-side film adhesion preventive electrode portion may mechanically be stripped on the outside of the apparatus so as to be used repeatedly, or may be discarded together with the back-side film adhesion preventive electrode where the electrode is prepared as a disposable one.

Fallen Particles

When films are continuously formed for a long time with use of the back-side film adhesion preventive electrode in the roll-to-roll system, the films may come off because of the stress of films deposited gradually on the back-side film adhesion preventive electrode. The films having come off fall in particles on the film-deposited continuous-length substrate, and thereafter the substrate with particles is transported up to rollers. Where the film-deposited continuous-length substrate carrying thereon the particles having fallen thereon passes the rollers, the particles cause the occurrence of impact marks.

Fallen-particle-removing Mechanism

The fallen-particle-removing mechanism according to the present invention is installed for the purpose of removing fallen particles before they pass rollers. It may have the shape of a plate (cloth or the like may be wound around it), a brush or a curtain, any of which may also be used in combination. As materials therefor, those having a high corrosion resistance such as SUS stainless steel and Ti are preferred. In the case of long-time film formation, insulating materials such as Teflon, heat-resistant vinyl chloride or FRP are preferred.

Figure 12A:
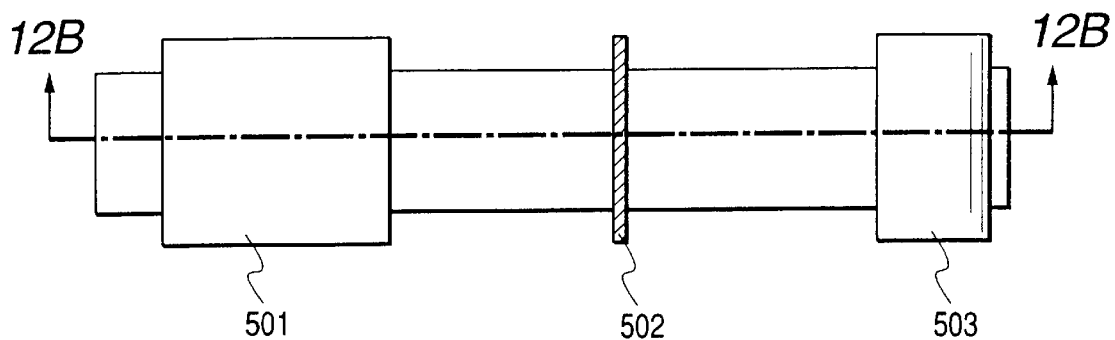
FIG. 12A is a diagrammatic plan view showing an example of a mechanism for removing particles, used in the present invention.
Figure 12B:
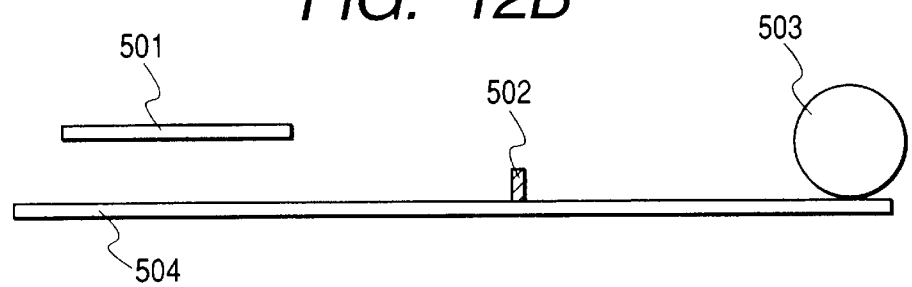
FIG. 12B is a cross-sectional view along the line 12B—12B of FIG. 12A.
Figure 13A:
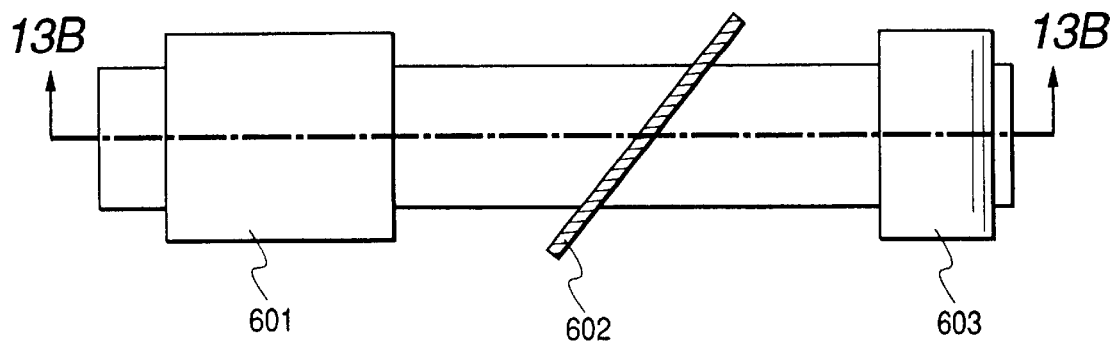
FIG. 13A is a diagrammatic plan view showing an example of a mechanism for removing particles, used in the present invention.
Figure 13B:
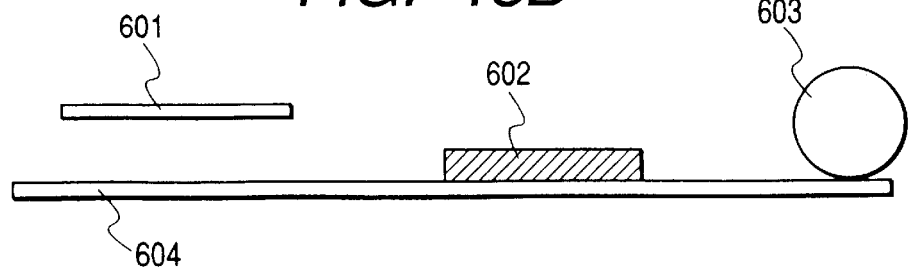
FIG. 13B is a cross-sectional view along the line 13B—13B of FIG. 13A.

Examples of how to install the fallen-particle-removing mechanism are shown in FIGS. 12A, 12B, 13A and 13B. FIG. 12B is a cross sectional view along the line 12B—12B in FIG. 12A. FIG. 13B is a cross sectional view along the line 13B—13B in FIG. 13A. In these drawings, reference numerals 501 and 601 denote back-side film adhesion preventive electrodes; 502 and 602, fallen-particle-removing mechanism; 503 and 603, rollers; and 504 and 604, continuous-length substrates. As shown in FIGS. 12A, 12B, 13A and 13B, a platelike fallen-particle-removing mechanism may be disposed in parallel or inclination to the transport direction of the continuous-length substrate. Also, the inclination of the fallen-particle-removing mechanism in its height direction may freely be changed according to materials therefor and so forth.

The process, and the apparatus, for forming zinc oxide films, having a means for removing fallen matter or dust adhering to the continuous-length substrate according to the present invention, are described below giving another example.

Figure 15:
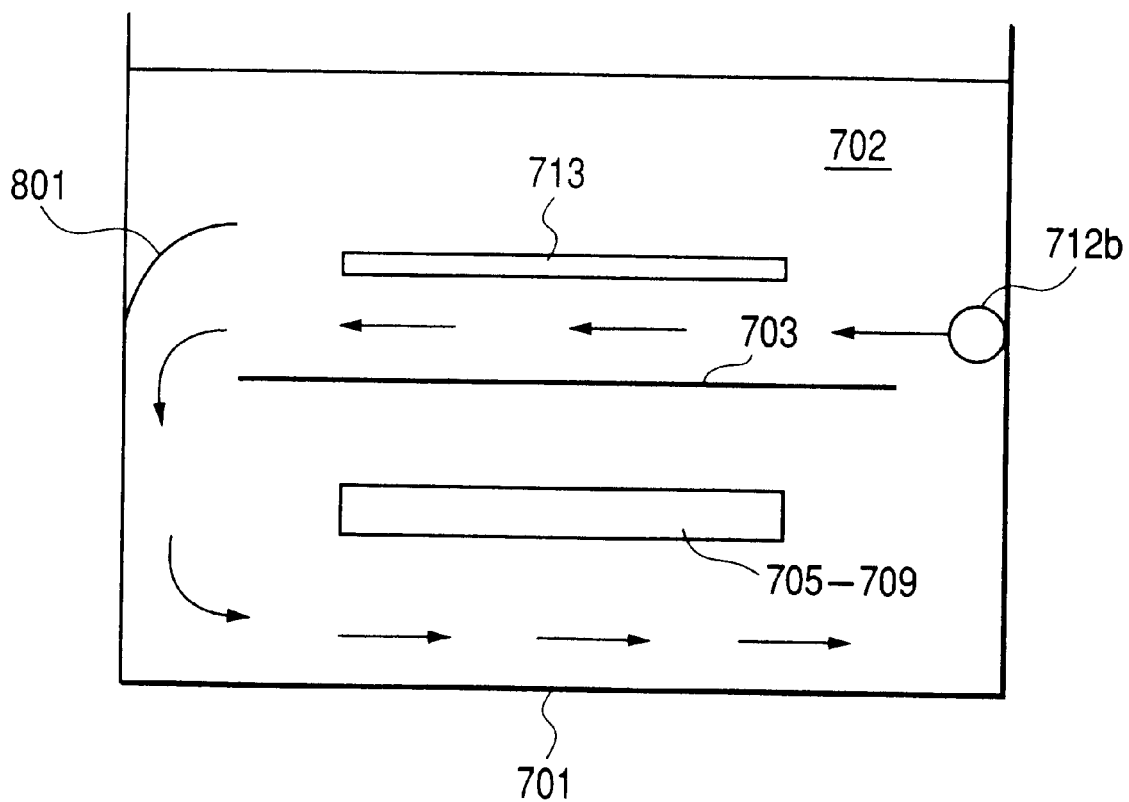
FIG. 15 is a cross-sectional view along the line 15—15 of FIG. 14, showing an example of a mechanism for removing particles, used in the present invention.

FIG. 14 is a diagrammatic view of an apparatus for forming a zinc oxide film on a continuous-length substrate. FIG. 15 is a cross-sectional view along the line 15—15 in FIG. 14.

First, an electrodeposition tank 701 is filled with an electrodeposition bath 702 having a predetermined concentration. The bath is well circulated by means of a circulation pump (not shown), and is kept heated constantly at a predetermined temperature by means of a heater provided in a solution holder tank (not shown).

This apparatus employs a means for removing fallen matter or dust adhering to the continuous-length substrate according to the present invention, in particular, a means for removing fallen matter or dust adhering to the substrate by utilizing convection of the bath. Stated specifically, a jet pipe 712b for stirring the electrodeposition bath 702 is so installed on the tank wall of the electrodeposition tank 701 that it does not overlap with a back-side film adhesion preventive electrode 713 so that the convection may take place vertically to the transport direction of the continuous-length substrate 703.

Next, the continuous-length substrate 703 is stretched across a substrate wind-off roller 710 and a substrate wind-up roller 711 so as to be set in the electrodeposition bath 702 via a power feed roller 704 and transport rollers. Anodes 705 to 709 are installed opposingly to the film-forming surface of the substrate. The back-side film adhesion preventive electrode 713 is provided opposingly to the back side of the substrate immediately at the rear of the anode 709 finally positioned.

A voltage is applied across the continuous-length substrate 703 and the anodes 705 to 709 in a mode of constant electric current to cause a transparent zinc oxide film to deposit on the surface of the continuous-length substrate. To the back-side film adhesion preventive electrode 713 provided immediately at the rear of the anode 709 finally positioned, a voltage is so applied that the back-side film adhesion preventive electrode 713 comes to be the cathode, setting the substrate side as the anode. Thus, the transparent zinc oxide film is successively formed on the continuous-length substrate 703 wound off from the substrate wind-off roller 710, and any unauthorized film having adhered to the back side is stripped off by the back-side film adhesion preventive electrode 713.

After the zinc oxide film has been formed, the film-deposited continuous-length substrate 703 is passed through a water washing tank 714 and a water washing shower 715 to wash away any bath remaining on the film-deposited substrate, which is then hydro-extracted with an air knife 716 and is finally passed through heating lamps 717 to effect drying. Thereafter, the film-deposited continuous-length substrate is wound up on the substrate wind-up roller 711.

Substrate

As materials for the substrate used in the apparatus shown in FIG. 14, any materials are usable as long as they ensure electrical conduction to their film-forming surfaces and are not attacked by the electrodeposition bath, and metals such as SUS stainless steel, Al, Cu and Fe may be used. Also usable are PET (polyethylene terephthalate) films coated with metals. Of these, SUS stainless steel is advantageous for the continuous-length substrate in order to carry out a device fabrication process in a post step.

As the SUS stainless steel, either of non-magnetic SUS stainless steel and magnetic SUS stainless steel may be used. The former is typified by SUS 304 stainless steel, which has so good abrasive properties that it can be made to have a mirror surface. The latter is typified by ferrite type SUS 430 stainless steel, which is effectively usable when transported by utilizing magnetic force.

The substrate may have a smooth surface or a rough surface. Surface properties can be changed by changing the type of a pressure roller in a SUS stainless steel rolling process. SUS stainless steel called BA has a surface close to mirror surface, and the one called 2D has a remarkably uneven surface. Any of the surfaces may have conspicuous hollows of microscopic order in observation by SEM (scanning electron microscopy). As substrates for solar cells, solar-cell characteristics greatly reflect surfaces having an uneven structure of microscopic order, in both a good direction and a bad direction, rather than those having a greatly undulated unevenness.

On the substrate, a film of different conductive material may further be formed, which may be selected according to the purpose of electrodeposition. In some cases, forming in advance a very thin layer of zinc oxide by a different process is preferred because deposition rate in electrodeposition can stably be improved. Certainly, the electrodeposition has an advantage that it is economical, but it is also advantageous to use two processes in combination as long as the cost reduction can be achieved in total even when a more or less expensive process is additionally employed.

Back-side Film Adhesion Preventive Electrode

Unauthorized electrodeposition films formed on the back side are removed by means of the back-side film adhesion preventive electrode. A potential negative to the substrate is applied to the back-side film adhesion preventive electrode. Hence, it is necessary for the both to stand float-output to each other especially so as to prevent interference with a power source for the electrodeposition. Electric current of from 50 mA/cm$^2$ to 70 mA/cm$^2$ per back-side electrode set in one electrodeposition tank is used. As materials for the back-side film adhesion preventive electrode, usable are Ti and SUS stainless steel, capable of providing a high hydrogen overvoltage. The distance between the back-side film adhesion preventive electrode and the substrate must be neither too small nor too large to show a sufficient effect, and they may preferably be installed at a distance of from 10 mm to 40 mm, and more preferably from 15 mm to 20 mm. Zinc oxide stripped from the back side of the substrate and collected at the back-side film adhesion preventive electrode portion may mechanically be stripped on the outside of the apparatus so as to be used repeatedly, or may be discarded together with the back-side film adhesion preventive electrode where the electrode is prepared as a disposable one.

Films Deposited on Back-side Film Adhesion Preventive Electrode

What is deposited in film on the back-side film adhesion preventive electrode is zinc oxide. The zinc oxide deposited on this back-side film adhesion preventive electrode is of hard and brittle nature. The film becomes deposited in such a manner that the film first comes to be deposited on the back-side film adhesion preventive electrode surface facing the substrate and, after it has become deposited to a certain extent, comes to grow in leaves from the part having a high electric field (i.e., electrode cross sections, electrode corners, and heads of bolts with which the electrode is fastened to a stay). The zinc oxide having grown into leaves is affected by the stirring of the bath and affected by the vibration of the substrate to come to fall from the back-side film adhesion preventive electrode. Also, the zinc oxide film deposited gradually on the back-side film adhesion preventive electrode increases in film thickness to cause film-peeling because of stress or the like the film itself has. Since the distance between the back-side film adhesion preventive electrode and the substrate is as close as from 10 mm to 40 mm, the leaf-like zinc oxide films having fallen are almost all carried up to a roller while being held on the film-deposited substrate to cause impact marks and roller-surface dents and flaws unwantedly.

Dust

When the zinc oxide film is continuously formed for a long time, zinc oxide powder may occur from a zinc plate used as the anode. Dust of zinc oxide powder having occurred from the anode may float in the bath as particles and come to adhere to the film-deposited substrate, and thereafter it is transported up to the roller. Where the dust adsorbed on the film-deposited continuous-length substrate passes the roller as it is, it is held between the film-deposited substrate and the roller to cause the occurrence of impact marks.

Impact Marks

What is called impact marks in the present invention refer to flaws produced when the fallen matter from the back-side film adhesion preventive electrode and the dust particles floating in the bath become adsorbed on the film-deposited substrate and are thereafter held between the roller and the film-deposited substrate. If such impact marks occur in the substrate after the zinc oxide film has been formed thereon, not only the surface appearance required as solar cell substrates is damaged but also cracks or film-peeling may occur in the zinc oxide film deposited by electrodeposition, resulting in a greatly low film quality. The size and shape of impact marks depends on the shape of fallen matter or dust having adhered. Also, where the fallen matter or dust having adhered to the film-deposited substrate is crushed when it passes the roller, and the fallen matter or dust has remained between the roller and the film-deposited substrate or on the roller, they may cause the occurrence of impact marks continually. Furthermore, not only they cause the occurrence of impact marks on the film-deposited substrate, but also cause dents, flaws and so forth at the roller surface also in respect of rollers which support the substrate, to lead the apparatus into a great damage.

Means for Removing Fallen Matter or Dust Adhering to Substrate

A means for removing fallen matter or dust adhering to the substrate, according to the present invention, is installed in order to remove fallen matter or dust adhering to the substrate, before it passes the roller. This means is made up by, e.g., a system in which the convection of the bath is utilized or a system in which a shower is provided on the front side of the roller and a jet from the shower is utilized.

Convection of Bath

As an example of the means for removing fallen matter or dust adhering to the substrate, according to the present invention, convection of the bath is available. This is a system in which convection currents are caused in the bath so that the bath can flow vertically to the substrate transport direction and also along the substrate film-forming surface or the substrate back side, to remove the fallen matter or dust adhering to the substrate. As specific construction, as shown in FIG. 15 a jet pipe 712b is installed on the tank wall of the electrodeposition tank 701 and a reflection plate 801 on the opposing tank wall so that convention currents are caused between the back-side film adhesion preventive electrode 713 and the continuous-length substrate 703 as shown by arrows, for example. The reflection plate 801 may have the shape of a flat plate. Taking account of readiness of causing the convection currents, it may preferably be an arcedly curved plate. If the convection currents as proposed in the present invention is caused in the whole bath, it is expected to accelerate the peeling of films deposited on the back-side film adhesion preventive electrode 713, and hence this is not desirable from the viewpoint of the prevention of impact marks. As the range in which convection currents are to be caused, the convection currents may preferably be caused at part or the whole space between the back-side film adhesion preventive electrode 713 and the roller provided on the downstream side of the continuous-length substrate in its transport direction.

Shower

As an example of the means for removing fallen matter or dust adhering to the substrate, according to the present invention, a shower is available. As the place at which this shower is to be installed, it may preferably be installed on the front side of the roller with which the substrate back side and film-forming side come into contact first after the film-deposited substrate passed the back-side film adhesion preventive electrode 713. As materials for the shower, SUS stainless steel may preferably be used taking account of strength, readiness for working and resistance to chemicals. As the structure of the shower, it may employ a simple structure in which, e.g., holes are made at several spots in a pipe made of SUS stainless steel, and besides a structure in which nozzles are provided on a pipe made of SUS stainless steel. The size of holes to be made in the pipe, the distance between the holes to be made and the nozzles to be provided and their angles to the substrate may appropriately be set so that the fallen matter or dust can be removed in a good efficiency. Also, as those to be jetted out of the shower, not only liquids such as the bath and the pure water but also gases may be used. Here, the flow rate of the liquids or gases may also appropriately be set so that the fallen matter or dust can be removed in a good efficiency.

When the above various conditions for the shower are set, care should be taken to install the shower in such a way that its spray does not strike the back-side film adhesion preventive electrode and the zinc oxide films deposited on the back-side film adhesion preventive electrode. Unless it is done so, the power of a jet from the shower may accelerate the peeling of the films deposited on the back-side film adhesion preventive electrode. This is not desirable from the viewpoint of the prevention of impact marks.

Figure 16A:
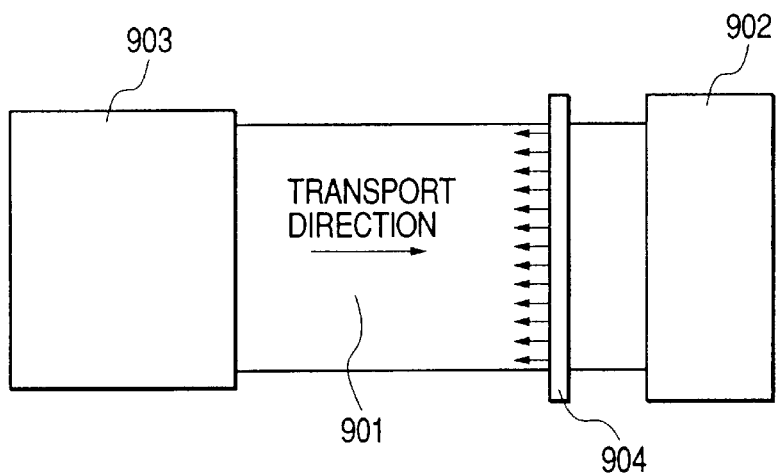
FIGS. 16A, 16B and 16C are diagrammatic plan views showing examples of a mechanism for removing particles, used in the present invention.
Figure 16B:
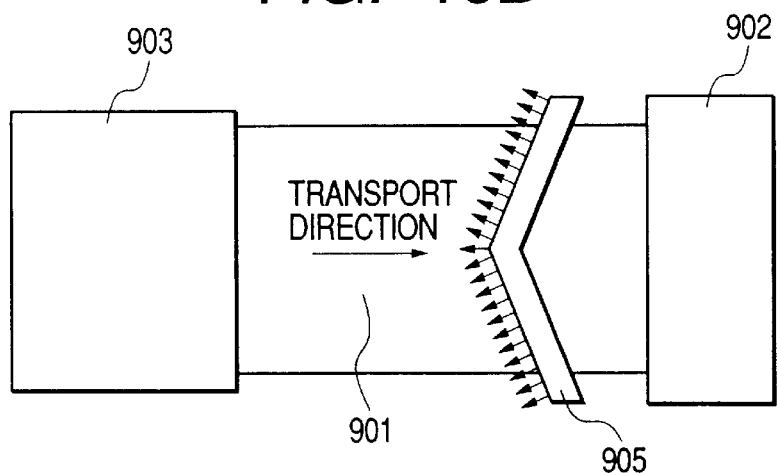
Figure 16C:
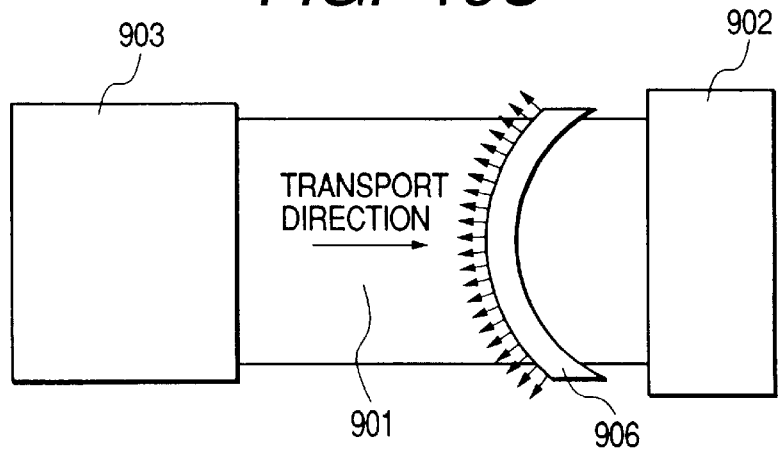

The shower may have any shape which may include I-shape type one in which, as shown in FIG. 16A, several nozzles or holes are arranged in a rank, V-shape type one in which, as shown in FIG. 16B, nozzles or holes are arranged in a V-shape, and arc type one in which, as shown in FIG. 16C, nozzles or holes are arranged in an arc. In FIGS. 16A to 16C, reference numeral 901 denotes the continuous-length substrate; 902, the transport roller; 903, the back-side film adhesion preventive electrode; 904, the I-shape type shower; 905, the V-shape type shower; and 906, the arc type shower.

Incidentally, the present invention is applicable not only where the film is formed on the continuous-length substrate, but also commonly where a substrate is transported in contact with a transport means.

EXAMPLES

The present invention will be described below in greater detail by giving Examples. The present invention is by no means limited to these Examples.

Example 1

Figure 11:
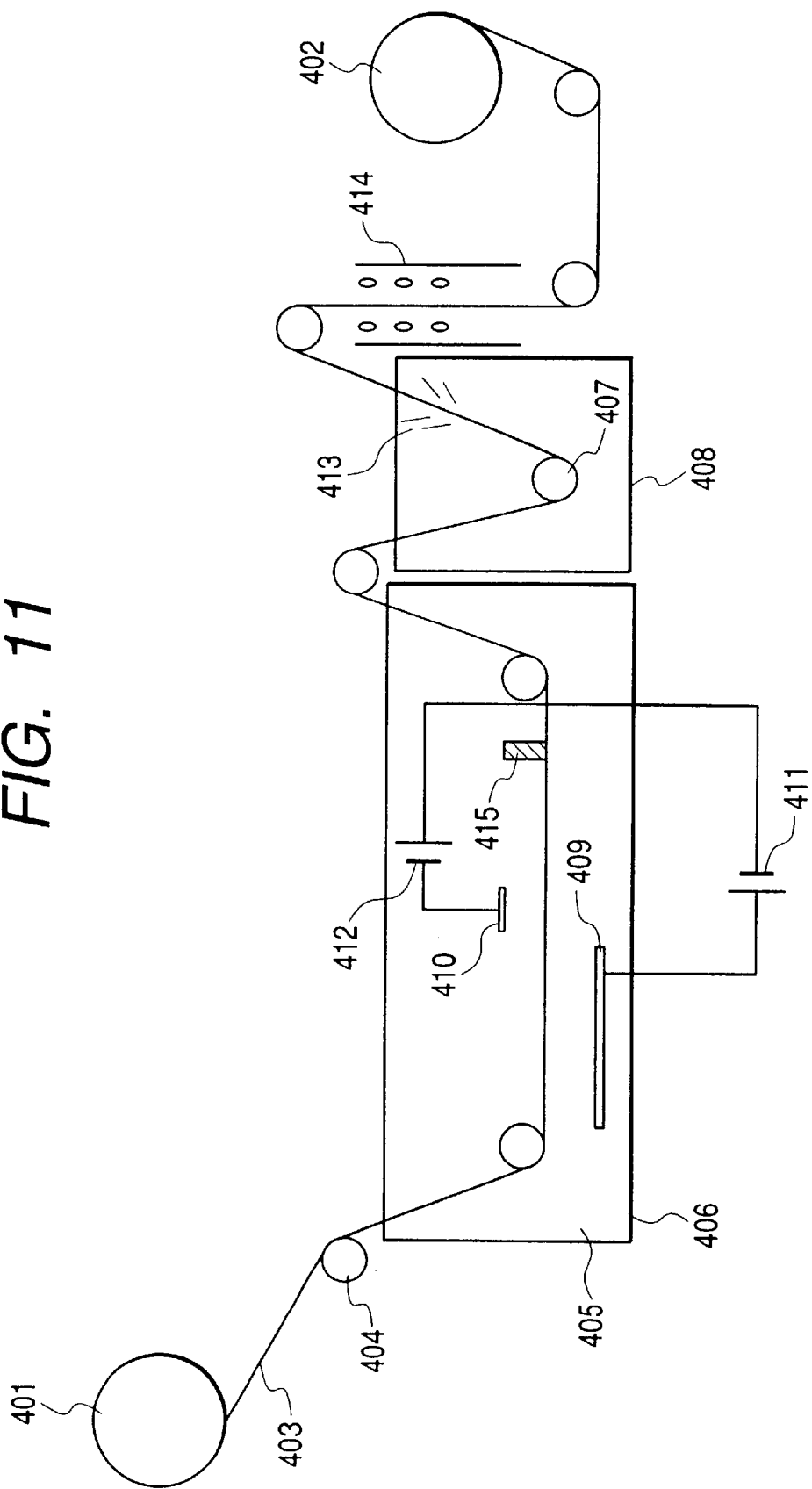
FIG. 11 is a diagrammatic cross-sectional view showing an example of an electrodeposition apparatus according to the present invention.

A roll-to-roll experimental apparatus shown in FIG. 11 was used to make experiment. On SUS 430 BA stainless steel sheet wound into a roll, previously silver was deposited in 2,000 Å thickness (the metal layer 102) by means of a roll-adapted DC magnetron sputtering apparatus and zinc oxide was deposited in thin film thereon in 1,000 Å thickness by means of a like roll-adapted DC magnetron sputtering apparatus to obtain a roll support 403. On this support, the zinc oxide film 103 was formed.

The roll support 403 is wound off from a wind-off roller 401, and is transported to a zinc oxide film forming tank 406 through a transport roller 404. A zinc oxide film forming bath 405 contains 0.1 mol/liter of zinc nitrate and 20 g/liter of sucrose. Liquid circulation means is disposed in order to stir the bath. The bath is kept at a temperature of 80° C. and also kept at a pH of 4.0 to 6.0. A zinc plate is used in an opposing electrode 409, and a back-side film adhesion preventive electrode 410 is further provided. Then, a fallen-particle-removing mechanism 415 according to the present invention is provided. This fallen-particle-removing mechanism is made up using 5 mm thick SUS 304 stainless steel, and is installed vertically to the substrate transport direction.

The roll support 403 was grounded. The opposing electrode 409 was set as the positive-side electrode (anode), where electric current of 5.0 mA/cm$^2$ (0.5 A/cm$^2$) was flowed across the electrode and the wound-off roll substrate 403, and electric current of −0.8 mA/cm$^2$ (0.08 A/cm$^2$) was further flowed across the support 403 and the back-side film adhesion preventive electrode 410 so that the back-side film adhesion preventive electrode 410 was in a more minus potential to carry out electrodeposition.

The number of impact marks visually observable on the film-deposited substrate standing immediately before it was wound up on a wind-up roller 402 through respective rollers was counted for 1 minute at intervals of 60 minutes over a period of 480 hours.

Results obtained are shown in Table 1.

Example 2

Electrodeposition was carried out in the same manner as in Example 1 except that the fallen-particle-removing mechanism 415 was made of an insulating material.

The number of impact marks visually observable on the film-deposited substrate standing immediately before it was wound up on the wind-up roller 402 through respective rollers was counted for 1 minute at intervals of 60 minutes over a period of 480 hours.

Results obtained are shown in Table 1.

Example 3

Electrodeposition was carried out in the same manner as in Example 2 except that the fallen-particle-removing mechanism 415 was so installed as to have an inclination with respect to the continuous-length substrate movement direction.

The number of impact marks visually observable on the film-deposited substrate standing immediately before it was wound up on the wind-up roller 402 through respective rollers was counted for 1 minute at intervals of 60 minutes over a period of 480 hours.

Results obtained are shown in Table 1.

Comparative Example 1

Electrodeposition was carried out in the same manner as in Example 1 except that the fallen-particle-removing mechanism 415 was not used.

The number of impact marks visually observable on the film-deposited substrate standing immediately before it was wound up on the wind-up roller 402 through respective rollers was counted for 1 minute at intervals of 60 minutes over a period of 480 hours.

Results obtained are shown in Table 1.

TABLE 1

|  | 60 min. | 120 min. | 180 min. | 240 min. | 300 min. | 360 min. | 420 min. | 480 min. |
|---|---|---|---|---|---|---|---|---|
| Example |  |  |  |  |  |  |  |  |
| 1 | 0 | 0 | 0 | 0 | 1 | 3 | 10 | 9 |
| 2 | 0 | 0 | 0 | 0 | 0 | 0 | 3 | 4 |
| 3 | 0 | 0 | 0 | 0 | 0 | 0 | 0 | 0 |
| Comparative Example 1 | 0 | 0 | 5 | 35 | 40 | 42 | 80 | 83 |

From the results shown in Table 1, the following can be concluded.

Where the fallen-particle-removing mechanism is provided, the impact marks can be made greatly less occur.

Where the fallen-particle-removing mechanism is made of an insulating material, any films can be prevented from adhering to the fallen-particle-removing mechanism as a result of electrodeposition and any impact marks can be prevented from occurring otherwise because of film-peeling from the fallen-particle-removing mechanism.

Where the fallen-particle-removing mechanism is made of an insulating material and installed to have an inclination, the particles having been removed can be held at a given place, so that the particles can be prevented from again floating and can make no impact marks occur.

Example 4

The roll-to-roll apparatus shown in FIGS. 2 to 9 was used to make experiment. On SUS 430 2D stainless steel sheet (the support 101) wound into a roll, previously aluminum was deposited in 2,000 Å thickness (the metal layer 102) by means of a roll-adapted DC magnetron sputtering apparatus and zinc oxide was deposited in thin film thereon in 2,000 Å thickness by means of a like roll-adapted DC magnetron sputtering apparatus to obtain the continuous-length substrate 2006. On this substrate, the zinc oxide film 103 was formed.

The continuous-length substrate 2006 is transported to zinc oxide film forming tanks. The first electrodeposition tank 2066 and the second electrodeposition tank 2116 each hold an electrodeposition bath containing 0.2 mol/liter of zinc nitrate and 1.0 g/liter of dextrin. Liquid circulation means are disposed in order to stir the baths. The baths are each kept at a temperature of 80° C. and also kept at a pH of 4.0 to 6.0.

Zinc plates (350 cm×150 cm) are used in the first electrodeposition anodes 2026 to 2049 and the second electrodeposition anodes 2076 to 2099. The continuous-length substrate 2006 was set as the negative-side electrode (cathode), where electric current of 10.0 mA/cm$^2$ (1.0 A/cm$^2$) was flowed across the positive-side electrodes 2026 to 2049 and 2076 to 2099 and the negative-side electrode 2006 each, and also the back-side film adhesion preventive electrodes 2061 and 2111 were set as negative-side electrodes and the continuous-length substrate 2006 was set as the positive-side electrode, where electric current of 50.0 mA/cm$^2$ (5.0 A/cm$^2$) was flowed across the positive-side electrode 2006 and the negative-side electrodes 2061 and 2111. Here, as the mechanisms 2060 and 2110 for removing the particles having fallen during transport of the continuous-length substrate, blades of 20 mm, made of Teflon, are installed at the rear of the back-side film adhesion preventive electrodes 2061 and 2111, respectively, in such a fashion that they each have an inclination with respect to the continuous-length substrate movement direction.

The film was continuously formed for 8 hours (720 minutes) at a substrate transport speed of 1,500 mm/minute. As the result, a zinc oxide film of 2.0 μm in film thickness was continuously formed.

As to the number of impact marks which might have occurred when the zinc oxide film was formed by electrodeposition, no impact mark was recognizable from the beginning to the end, in the one-minute visual observation.

After the metal layer 102 and the zinc oxide film 103 were formed on the support 101 in this way, a triple-structure semiconductor layer 104 was formed on this zinc oxide film 103 by means of a roll-adapted CVD apparatus. First, a mixed gas of silane and phosphine was used, the metal layer 102 and zinc oxide film 103 formed on the support 101 were heated to 340° C. and an RF (radio frequency) power of 400 W was applied to form an n-type layer. Next, a mixed gas of silane, germane and hydrogen was used and a microwave power of 400 W was applied, setting substrate temperature at 450° C., to from an i-type layer. Then, setting substrate temperature to 250° C., a p-type layer was further formed using a mixed gas of boron trifluoride, silane and hydrogen. Thus, a bottom p-i-n layer was formed. Subsequently, a middle n-i-p layer was formed in the same manner as the above except that the ratio of mixing silane and germane in the i-type layer was made larger. Then a top p-i-n layer was formed in the same manner as the above except that the i-type layer was formed using silane and hydrogen.

Thereafter, ITO (indium-tin oxide) was deposited by a roll-adapted sputtering apparatus to form the transparent conductive layer 105. Thereafter, the collector electrode layer 106 was formed using silver paste (see FIG. 1).

Of sample devices prepared, with regard to a device corresponding to the part immediately after the start of zinc oxide electrodeposition and a device corresponding to the part immediately before its finish, their photoelectric conversion efficiency was measured with a solar simulator (AM 1.5, 100 mW/cm$^2$ and surface temperature of 25° C.). These devices were further subjected to an H/H (high temperature/high humidity) test as an accelerated test (the devices were put in an environmental test box for 1,000 hours, having an environment of 85° C. temperature and 85% humidity) to measure the rate of deterioration of photoelectric conversion efficiency.

Results of the above are shown in Table 2.

Comparative Example 2

A zinc oxide film was formed and devices were produced in the same manner as in Example 4 except that the fallen-particle-removing mechanism was not used.

The number of impact marks occurring when the zinc oxide film was formed by electrodeposition was 0 immediately after its start and began to gradually increase after two hours to become 113 immediately before its finish, in the one-minute visual observation.

Of samples prepared in this way, with regard to a device obtained on the zinc oxide film at the part immediately after the start of zinc oxide electrodeposition and a device obtained thereon at the part immediately before its finish, their photoelectric conversion efficiency was measured with a solar simulator (AM 1.5, 100 mW/cm² and surface temperature of 25° C.). These devices were further subjected to an H/H test as an accelerated test (the devices were put in an environmental test box for 1,000 hours, having an environment of 85° C. temperature and 85% humidity) to measure the rate of deterioration of photoelectric conversion efficiency.

Results of the above are shown in Table 2.

electrodeposition tank 701 and the reflection plate 801 on the opposing tank wall so that convention currents are caused between the back-side film adhesion preventive electrode 713 and the continuous-length substrate 703 as shown by arrows. Since the system is so constructed that the convention currents can be caused vertically to the substrate transport direction, any falling matter having fallen on the film-deposited substrate can effectively be removed.

In the present Example, electric current of 5.0 mA/cm² was flowed across the anodes 705 to 709 and the continuous-length substrate 703 to carry out electrodeposition. Electric current of −60 mA/cm² was further flowed across the continuous-length substrate and the back-side film adhesion preventive electrode 713 so that the back-side film adhesion preventive electrode 713 was in a more minus potential, to remove unauthorized films having adhered to the back side of the continuous-length substrate.

The number of impact marks visually observable on the film-deposited substrate standing immediately before it was

TABLE 2

| | Number of impact marks at the time of zinc oxide film formation (marks/minute) | | Photoelectric conversion efficiency (relative comparison*) | | Deterioration rate of photoelectric conversion efficiency (%) | |
|---|---|---|---|---|---|---|
| | Immediately after start | Immediately before finish | Immediately after start | Immediately before finish | Immediately after start | Immediately before finish |
| Example 4 | 0 | 0 | 1 | 1.02 | 2 | 3 |
| Comparative Example 2 | 0 | 113 | 0.98 | 1.01 | 2 | 31 |

*with that of Example 4, immediately after start

From the results shown in Table 2, the following can be concluded.

Where the film-deposited substrate is used which has been produced using the fallen-particle-removing mechanism of the present invention, provided at the time of zinc oxide film formation, devices having a high reliability can be produced over a long time in the roll-to-roll system.

Example 5

The roll-to-roll experimental apparatus shown in FIG. 14 was used to make experiment. On SUS 430 2D stainless steel sheet wound into a roll, previously silver was deposited in 200 nm (2,000 Å) thickness by means of a roll-adapted DC magnetron sputtering apparatus to form a metal layer and zinc oxide was deposited in thin film thereon in 100 nm (1,000 Å) thickness by means of a like roll-adapted DC magnetron sputtering apparatus to obtain the continuous-length substrate 703. On this substrate, a zinc oxide film was formed by electrodeposition.

The continuous-length substrate 703 is transported to the electrodeposition tank 701 through transport rollers. The electrodeposition bath 702 contains 0.2 mol/liter of zinc nitrate and 0.1 g/liter of dextrin. Liquid circulation means is disposed using the jet pipe 712 in order to stir the bath. The bath is kept at a temperature of 80° C. and also kept at a pH of 4.0 to 6.0. Zinc plates are used in the anodes 705 to 709.

Then, in the present Example, the method utilizing the convection of the electrodeposition bath was used as a means for removing fallen matter or dust adhering to the substrate. As specific construction for this method utilizing the convection of the electrodeposition bath, as shown in FIG. 15 the jet pipe 712b is installed on the tank wall of the wound up on the wind-up roller 711 through respective rollers was counted for 1 minute at intervals of 60 minutes over a period of 480 hours.

Results obtained are shown in Table 3.

Comparative Example 3

Electrodeposition was carried out in the same manner as in Example 5 except that the means (the jet pipe 712) for removing fallen matter or dust adhering to the film-deposited substrate was not used.

The number of impact marks visually observable on the film-deposited substrate standing immediately before it was wound up through respective rollers was counted for 1 minute at intervals of 60 minutes over a period of 480 hours.

Results obtained are shown in Table 3.

Example 6

Electrodeposition was carried out in the same manner as in Example 5 except that, in place of the convection of the electrodeposition bath, the means for removing fallen matter or dust adhering to the film-deposited substrate was so constructed as to be the shower which as shown FIG. 16B sprays the bath in a V-shape with respect to the continuous-length substrate transport direction. Here, the shower was so installed that its jet angle was 30 degrees with respect to the continuous-length substrate transport direction 901. Also, the holes of the shower were made in a diameter of 2 mm, and arranged at intervals of 20 mm. Its bath flow rate was set at 2 liters/minute.

The number of impact marks visually observable on the film-deposited substrate standing immediately before it was wound up through respective rollers was counted for 1 minute at intervals of 60 minutes over a period of 480 hours.

Results obtained are shown in Table 3.

Example 7

Electrodeposition was carried out in the same manner as in Example 5 except that, as the means for removing fallen matter or dust adhering to the substrate, the shower shown in FIG. 16A was additionally installed so that any dust adhering to the film surface was also removable.

The number of impact marks visually observable on the film-deposited substrate standing immediately before it was wound up through respective rollers was counted for 1 minute at intervals of 60 minutes over a period of 480 hours.

Results obtained are shown in Table 3.

TABLE 3

| | 60 min. | 120 min. | 180 min. | 240 min. | 300 min. | 360 min. | 420 min. | 480 min. |
|---|---|---|---|---|---|---|---|---|
| Example | | | | | | | | |
| 5 | 0 | 0 | 0 | 0 | 1 | 4 | 11 | 10 |
| 6 | 0 | 0 | 0 | 0 | 0 | 1 | 2 | 4 |
| 7 | 0 | 0 | 0 | 0 | 0 | 0 | 0 | 0 |
| Comparative Example 3 | 0 | 0 | 3 | 36 | 42 | 48 | 81 | 89 |

From the results shown in Table 3, the following can be concluded.

1) Where the method in which the convection of the electrodeposition bath is utilized as the means for removing fallen matter or dust adhering to the substrate, the impact marks can be made greatly less occur.
2) Where the means for removing fallen matter or dust adhering to the film-deposited substrate is made up by the shower which sprays the bath in a V-shape with respect to the continuous-length substrate transport direction, the fallen matter or dust adhering to the film-deposited substrate can more effectively be removed and the impact marks can be prevented from occurring.
3) Where the shower for removing fallen matter or dust adhering to the film-deposited substrate is provided on the back side of the substrate and also on the film-forming side of the substrate, not only the fallen matter from the back-side film adhesion preventive electrode but also any dust adsorbed on film-formed surface can be prevented, enabling formation of high-quality zinc oxide films while preventing impact marks from occurring.

Example 8

Figure 17:
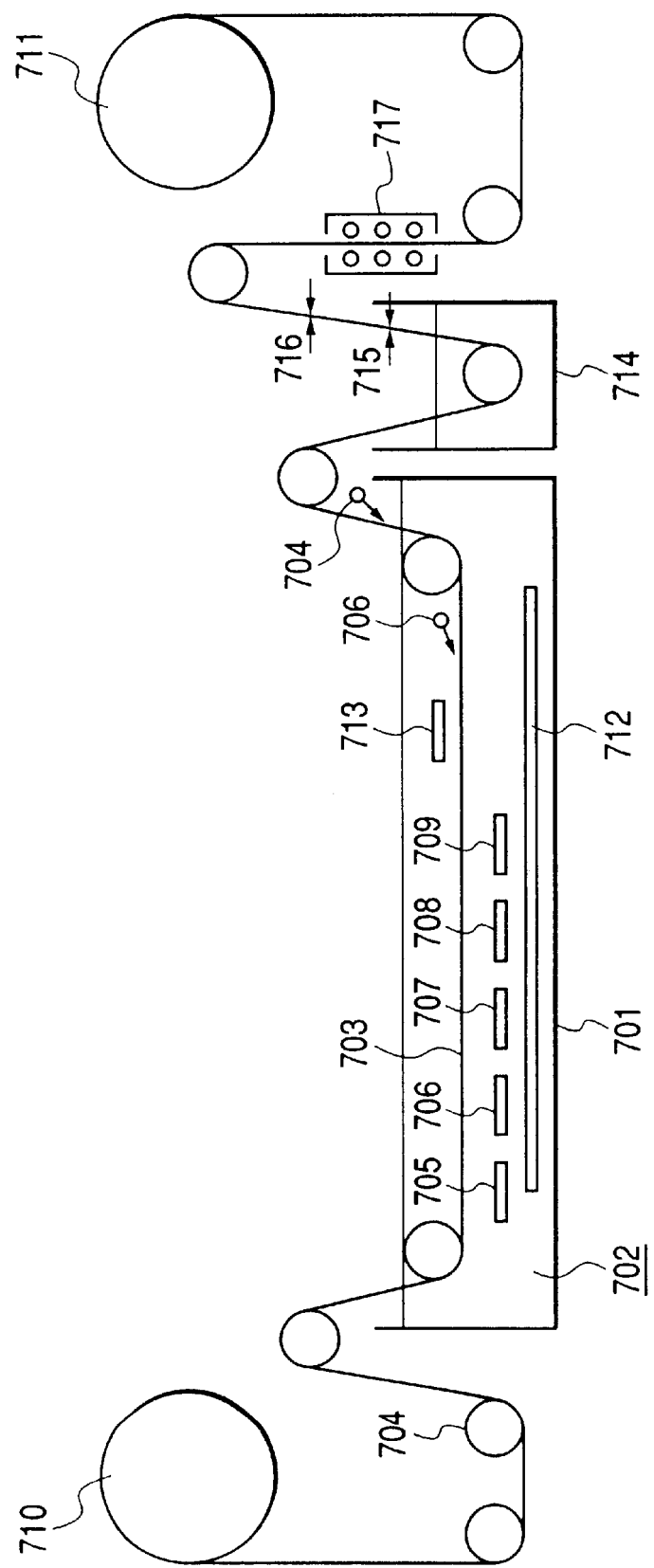
FIG. 17 is a diagrammatic cross-sectional view showing an example of an electrodeposition apparatus according to the present invention.

A roll-to-roll type apparatus shown in FIG. 17 was used to make experiment. On SUS 430 2D stainless steel sheet wound into a roll, previously aluminum was deposited in 200 nm (2,000 Å) thickness by means of a roll-adapted DC magnetron sputtering apparatus to form a metal layer and zinc oxide was deposited in thin film thereon in 200 nm (2,000 Å) thickness by means of a like roll-adapted DC magnetron sputtering apparatus to obtain a continuous-length substrate 703. On this substrate, a zinc oxide film was formed by electrodeposition.

The continuous-length substrate 703 is transported to the electrodeposition tank 701 through transport rollers. An electrodeposition bath 702 contains 0.2 mol/liter of zinc nitrate and 1.0 g/liter of dextrin. Liquid circulation means is disposed using a jet pipe 712 in order to stir the bath. The bath is kept at a temperature of 80° C. and also kept at a pH of 4.0 to 6.0.

Zinc plates (350 cm×150 cm) are used in anodes 705 to 709. The continuous-length substrate 703 was set as the negative-side electrode, where electric current of 10.0 mA/cm$^2$ (1.0 A/cm$^2$) was flowed across each of the the positive-side electrodes 705 to 709 and the negative-side electrode 703, and also a back-side film adhesion preventive electrode 713 was set as the negative-side electrode and the continuous-length substrate 703 as the positive-side electrode, where electric current of 50.0 mA/cm$^2$ (5.0 A/cm$^2$) was flowed across them, setting the distance between the positive-side electrode 703 and the negative-side electrode 713 to be 20 mm.

Here, as a means for removing fallen matter or dust adhering to the film-deposited continuous-length substrate during its transport, the shower 906 which as shown in FIG. 16C blows compressed air in an arc shape with respect to the continuous-length substrate transport direction was installed on the front side of the roller with which the substrate back side come into contact first after the film-deposited substrate passed the back-side film adhesion preventive electrode, and so installed that it jetted the air at an angle of 20 degrees with respect to the continuous-length substrate transport direction 901. Also, the shower 904 which as shown in FIG. 16A sprays the bath in an I-shape with respect to the substrate transport direction was installed on the front side of the roller with which the substrate film-forming side come into contact first after the film-deposited substrate passed the back-side film adhesion preventive electrode, and so installed that it jetted the bath at an angle of 30 degrees with respect to the substrate transport direction 901. Here, the holes of each shower were made in a diameter of 1 mm, and arranged at intervals of 15 mm. Flow rates of the compressed air and the bath were set at 200 NL/minute and 3 L/minute, respectively. Here, "NL" is a unit showing volume (liter) at the standard condition.

A zinc oxide film of 2.0 μm in film thickness was continuously formed. The film was continuously formed for 8 hours at a substrate transport speed of 1,500 mm/minute.

As the result, as to the number of impact marks which might have occurred when the zinc oxide film was formed, no impact mark was recognizable from the beginning to the end, in the one-minute visual observation made at intervals of 60 minutes over a period of 480 hours.

Example 9

The roll-to-roll type apparatus shown in FIG. 17 was used to make experiment. On SUS 430 2D stainless steel sheet wound into a roll, previously silver was deposited in 800 nm (8,000 Å) thickness by means of a roll-adapted DC magnetron sputtering apparatus to form a metal layer and zinc oxide was deposited in thin film thereon in 200 nm (2,000 Å) thickness by means of a like roll-adapted DC magnetron sputtering apparatus to obtain the continuous-length substrate 703. On this substrate, a zinc oxide film was formed by electrodeposition.

The continuous-length substrate 703 is transported to the electrodeposition tank 701 through transport rollers. The electrodeposition bath 702 contains 0.2 mol/liter of zinc nitrate and 1.0 g/liter of dextrin. Liquid circulation means is disposed using the jet pipe 712 in order to stir the bath. The bath is kept at a temperature of 83° C. and also kept at a pH of 4.0 to 6.0.

Zinc plates (350 cm×150 cm) are used in the anodes 705 to 709. The continuous-length substrate 703 was set as the negative-side electrode, where electric current of 10.0 mA/cm$^2$ (1.0 A/cm$^2$) was flowed across each of the the positive-side electrodes 705 to 709 and the negative-side electrode 703, and also the back-side film adhesion preventive electrode 713 was set as the negative-side electrode and the continuous-length substrate 703 as the positive-side electrode, where electric current of 50.0 mA/cm$^2$ (5.0 A/cm$^2$) was flowed across them, setting the distance between the positive-side electrode 703 and the negative-side electrode 713 to be 20 mm.

Here, as a means for removing fallen matter or dust adhering to the film-deposited continuous-length substrate during its transport, the shower 906 which as shown in FIG. 16C blows compressed air in an arc shape with respect to the continuous-length substrate transport direction was installed on the front side of the roller with which the substrate back side come into contact first after the film-deposited substrate passed the back-side film adhesion preventive electrode, and so installed that it jetted the air at an angle of 45 degrees with respect to the continuous-length substrate transport direction 901. Also, the shower 904 which as shown in FIG. 16A sprays the bath in an I-shape with respect to the substrate transport direction was installed on the front side of the roller with which and the continuous-length substrate 703 as the positive-side electrode, where electric current of 50.0 mA/cm$^2$ (5.0 A/cm$^2$) was flowed across them, setting the distance between the positive-side electrode 703 and the negative-side electrode 713 to be 20 mm.

Here, as a means for removing fallen matter or dust adhering to the film-deposited continuous-length substrate during its transport, the shower 906 which as shown in FIG. 16C blows compressed air in an arc shape with respect to the continuous-length substrate transport direction was installed on the front side of the roller with which the substrate back side come into contact first after the film-deposited substrate passed the back-side film adhesion preventive electrode, and so installed that it jetted the air at an angle of 40 degrees with respect to the continuous-length substrate transport direction 901. Also, the shower 904 which as shown in FIG. 16A sprays the bath in an I-shape with respect to the substrate transport direction was installed on the front side of the roller with which the substrate film-forming side come into contact first after the film-deposited substrate passed the back-side film adhesion preventive electrode, and so installed that it jetted the bath at an angle of 25 degrees with respect to the substrate transport direction 901. Here, the holes of each shower were made in a diameter of 2.5 mm, and arranged at intervals of 15 mm. Flow rates of the compressed air and the bath were set at 300 NL/minute and 4 L/minute, respectively.

A zinc oxide film of 2.0 μm in film thickness was continuously formed. The film was continuously formed for 8 hours at a substrate transport speed of 1,500 mm/minute.

As the result, as to the number of impact marks which might have occurred when the zinc oxide film was formed, no impact mark was recognizable from the beginning to the end, in the one-minute visual observation made at intervals of 60 minutes over a period of 480 hours.

Figure 18:
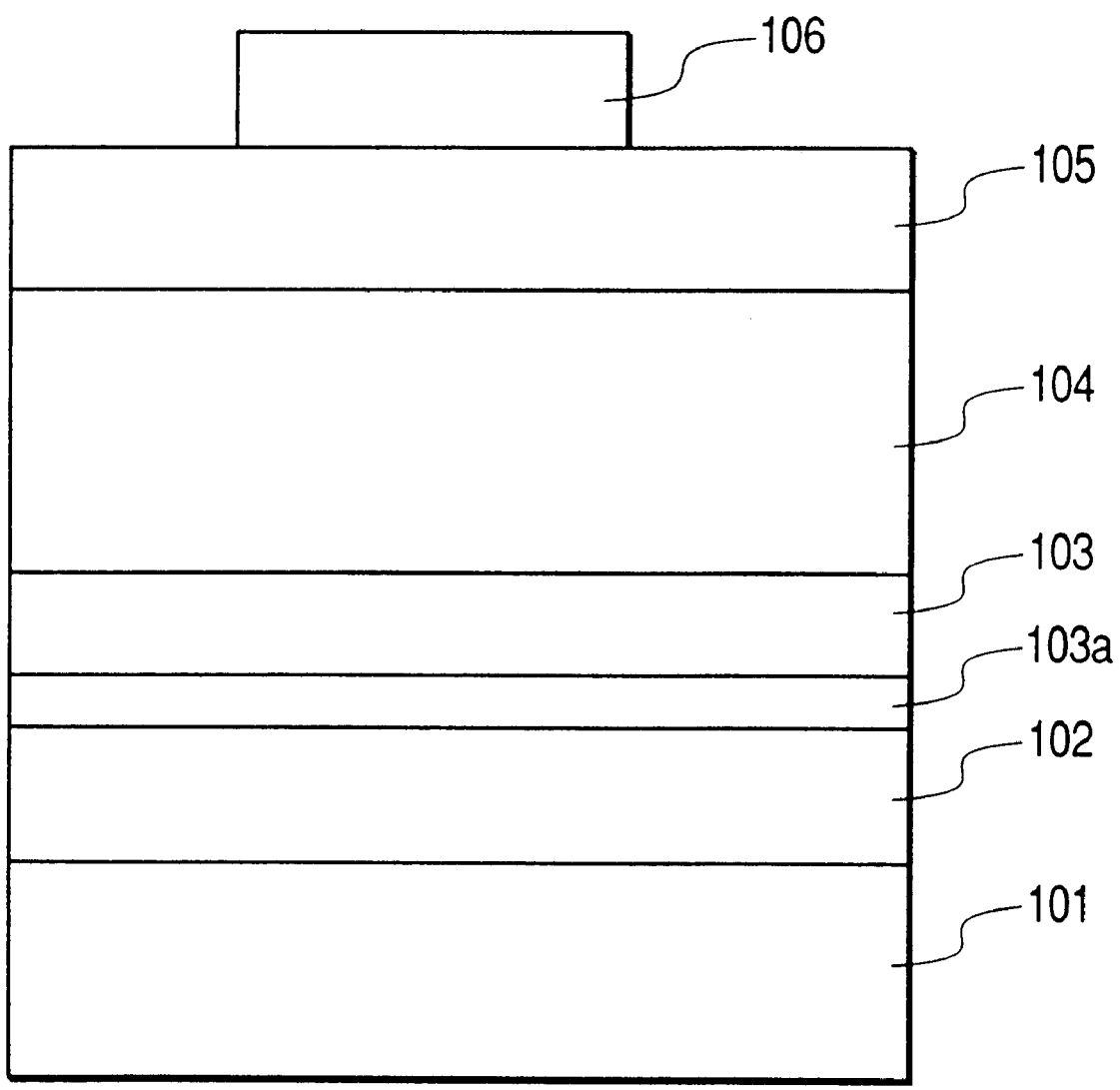
FIG. 18 is a diagrammatic cross-sectional view showing an example of a photovoltaic device produced using the present invention.

Next, using the substrate having the zinc oxide film thus formed, a photovoltaic device having a cross-sectional structure as schematically shown in FIG. 18 was produced. In FIG. 18, reference numeral 101 denotes a support (SUS stainless steel substrate); 102, a metal layer (silver, 800 nm thick); 103a, a zinc oxide layer (200 nm thick) formed by sputtering; 103, a zinc oxide film formed by the electrodeposition described above; 104, a semiconductor layer of triple structure; 105, a transparent conductive layer; and 106, a collector electrode layer.

First, the triple-structure semiconductor layer 104 was formed by means of a roll-adapted CVD apparatus. Stated specifically, a mixed gas of SiH$_4$ and PH$_3$ was used, a substrate member (consisting of the support 101 and formed thereon the metal layer 102, the zinc oxide layer 103a and the zinc oxide film 103 formed by electrodeposition) was heated to 340° C. and an RF power of 400 W was applied to from an n-type layer. Next, a mixed gas of SiH$_4$, GeH$_4$ and hydrogen was used and a microwave power of 400 W was applied, setting substrate temperature at 450° C., to from an i-type layer. Then, setting substrate temperature to 250° C., a p-type layer was further formed using a mixed gas of BF$_3$, SiH$_4$ and hydrogen. Thus, a bottom n-i-p layer was formed. Subsequently, a middle n-i-p layer was formed in the same manner as the above except that the ratio of mixing SiH$_4$ and GeH$_4$ in the i-type layer was changed. Then a top n-i-p layer was formed in the same manner as the above except that the i-type layer was formed using SiH$_4$ and hydrogen.

Thereafter, ITO was deposited by a roll-adapted sputtering apparatus to form the transparent conductive layer 105. Thereafter, the collector electrode layer 106 was formed using silver paste.

Of sample devices prepared, with regard to a device corresponding to the part immediately after the start of zinc oxide electrodeposition and a device corresponding to the part immediately before its finish, their photoelectric conversion efficiency and acceptance rate were measured with a solar simulator (AM 1.5, 100 mW/cm$^2$ and surface temperature of 25° C.). These devices were further subjected to an H/H test as an accelerated test (the devices were put in an environmental test box for 1,000 hours, having an environment of 85° C. temperature and 85% humidity) to measure the photoelectric conversion efficiency before and after the test.

Results of the above are shown in Table 5.

Comparative Example 5

A zinc oxide film was formed in the same manner as in Example 10 except that the means for removing fallen matter or dust adhering to the film-deposited continuous-length substrate during its transport was not used.

The number of impact marks occurring when the zinc oxide film was formed by electrodeposition was 0 immediately after its start and began to gradually increase after two hours to become 120 immediately before its finish, in the one-minute visual observation made at intervals of 60 minutes over a period of 480 hours.

Of sample devices prepared, with regard to a device corresponding to the part immediately after the start of zinc oxide electrodeposition and a device corresponding to the part immediately before its finish, their photoelectric conversion efficiency and acceptance rate were also measured with a solar simulator (AM 1.5, 100 mW/cm$^2$ and surface temperature of 25° C.). These devices were further subjected to an H/H test as an accelerated test (the devices were put in an environmental test box for 1,000 hours, having an environment of 85° C. temperature and 85% humidity) to measure the photoelectric conversion efficiency before and after the test.

Results of the above are shown in Table 5.

TABLE 5

| | Example 10 | | Comparative Example 5 | |
|---|---|---|---|---|
| | Immediately after start of electro-deposition (0 m) | Immediately before finish of electro-deposition (720 m) | Immediately after start of electro-deposition (0 m) | Immediately before finish of electro-deposition (720 m) |
| Number of impact marks at the time of zinc oxide film formation: (marks/min.) | 0 | 0 | 0 | 120 |
| Photoelectric conversion efficiency | 1 | 1.01 | 0.98 | 1.02 |
| Acceptance rate: (%) | 96 | 100 | 100 | 68 |
| Rate of changes: (%) | 99 | 97 | 98 | 68 |

Photoelectric Conversion Efficiency

Relative value when the photoelectric conversion efficiency of the device corresponding to the part immediately after the start of electrodeposition (0 m) in Example 10 is assumed as 1.

Acceptance Rate

Percentage of non-defective samples when twenty-five sub-cells are produced in a size of 50 mm square.

Rate of Changes (Photoelectric conversion efficiency after H/H test/photoelectric conversion efficiency after H/H test)×100.

From the results shown in Table 5, the following can be concluded.

There was no particular difference in photoelectric conversion efficiency at the initial stage. However, in Comparative Example 5, in which the zinc oxide film was formed without providing any means of the present invention for removing fallen matter or dust adhering to the substrate during zinc oxide film formation, compared with samples corresponding to the part immediately after the start of electrodeposition, those immediately before its finish showed a low acceptance rate and a decrease in the photoelectric conversion efficiency after the H/H test. This is considered due to the fact that cracks had been caused in the zinc oxide film because the film-deposited substrate has impact marks.

The samples of Example 10, which made use of the film-deposited substrate free of any impact marks, produced using the apparatus provided with the means for removing fallen matter or dust adhering to the substrate during zinc oxide film formation according to the present invention, showed little difference in the acceptance rate and the photoelectric conversion efficiency after the H/H test between the samples corresponding to the part immediately after the start of electrodeposition and those immediately before its finish, enabling production of highly reliable good devices for a long time in the roll-to-roll system.

As having been described above, according to the present invention, high-quality zinc oxide films can be formed continuously for a long time without causing any impact marks which might be caused when fallen matter such as film pieces coming from the back-side film adhesion preventive electrode and so forth and any adsorbed matter such as dust adhere to the film-deposited continuous-length substrate to become crushed by rollers, and also without causing any cracks in film and any film-peeling. Also, since the fallen matter or dust is not caught in rollers, the rollers can be prevented from having dents or flaws and the apparatus can be greatly less damaged. Moreover, since the impact marks may occur no where, the yield can be improved and the cost reduction can be achieved.

Introduction of this zinc oxide film formation technique into solar-cell fabrication processes as a technique for forming the back reflecting layer also enables solar cells to have higher short-circuit current density and photoelectric conversion efficiency and also enables them to be improved in acceptance rate and reliability. Also, compared with sputtering and vacuum evaporation, the material cost and running cost can be made very low, and hence the present invention can contribute to real spread of sunlight electricity generation.

What is claimed is:

1. An electrodeposition process for electrodepositing a zinc oxide film in an electrodeposition bath comprising the steps of supplying a continuous-length substrate having a zinc oxide film formed thereon, an opposing electrode and a back-side film adhesion preventive electrode; forming the film on the continuous-length substrate while transporting the continuous-length substrate under electrification so made as to be in the relation of potential which stands back-side film adhesion preventive electrode<continuous-length substrate<opposing electrode; and removing particles separated from the back-side film adhesion preventive electrode from the surface of the continuous-length substrate.

2. The electrodeposition process according to claim 1, wherein the particles are removed by means of a member comprising an insulating material.

3. The electrodeposition process according to claim 1, wherein the particles are removed by means of a member so disposed that its longitudinal direction is in a direction not being at right angles to the transport direction of the continuous-length substrate; the member being brought into contact with the continuous-length substrate to make the particles move in a direction different from the transport direction of the continuous-length substrate.

4. The electrodeposition process according to claim 1, wherein the particles are dust floating in the bath.

5. The electrodeposition process according to claim 1, wherein the particles are removed by convection of the electrodeposition bath.

6. The electrodeposition process according to claim 5, wherein the electrodeposition bath is convected in a direction of convection which is different from the transport direction of the continuous-length substrate, to make the particles move in a direction different from the transport direction of the continuous-length substrate.

7. The electrodeposition process according to claim 1, wherein the particles are removed by spraying a liquid or blowing a gas on the continuous-length substrate.

8. The electrodeposition process according to claim 7, wherein the liquid or gas is sprayed or blown in a direction different from the transport direction of the continuous-length substrate, to make the particles move in a direction different from the transport direction of the continuous-length substrate, to make the particles move in a direction different from the transport direction of the continuous-length substrate.

9. The electrodeposition process according to claim 1, wherein the particles are removed after the continuous-length substrate has passed a region where the continuous-length substrate faces the back-side film adhesion preventive electrode and before the continuous-length substrate comes into contact with a mechanism for transporting the continuous-length substrate.

10. The electro-deposition process according to claim 9, wherein the mechanism for transporting the continuous-length substrate is a roller.

11. The electrodeposition process according to claim 1, wherein a continuous-length substrate on the outermost surface of which a zinc oxide film has been formed by sputtering is used as the continuous-length substrate.

12. A process for producing a photovoltaic device, comprising a step of conducting the electrodeposition process of claim 1 to provide a continuous-length substrate having a zinc oxide film thereon and thereafter a step of forming a semiconductor layer on the zinc oxide film.

* * * * *